(12) United States Patent
Nonclercq et al.

(10) Patent No.: US 11,741,154 B2
(45) Date of Patent: Aug. 29, 2023

(54) 3D CLUSTERING NAVIGATION

(71) Applicant: Dassault Systemes, Velizy-Villacoublay (FR)

(72) Inventors: Arnaud Nonclercq, Velizy-Villacoublay (FR); Antoine Villedieu De Torcy, Velizy-Villacoublay (FR); Paul Vardon, Paris (FR)

(73) Assignee: Dassault Systemes, Velizy-Villacoublay (FR)

( * ) Notice: Subject to any disclaimer, the term of this patent is extended or adjusted under 35 U.S.C. 154(b) by 112 days.

(21) Appl. No.: 17/503,163

(22) Filed: Oct. 15, 2021

(65) Prior Publication Data

US 2022/0121703 A1  Apr. 21, 2022

(30) Foreign Application Priority Data

Oct. 15, 2020  (EP) .................................... 20306218

(51) Int. Cl.
*G06F 16/30* (2019.01)
*G06F 16/538* (2019.01)
*G06F 16/55* (2019.01)
*G06F 16/51* (2019.01)

(52) U.S. Cl.
CPC ............ *G06F 16/538* (2019.01); *G06F 16/51* (2019.01); *G06F 16/55* (2019.01)

(58) Field of Classification Search
CPC ......... G06F 16/538; G06F 16/55; G06F 16/51
See application file for complete search history.

(56) References Cited

U.S. PATENT DOCUMENTS

| 8,675,672 B1* | 3/2014 | Bao .......................... H04L 45/46 370/408 |
| 2017/0075958 A1* | 3/2017 | Duffy .................. G06F 16/2455 |

OTHER PUBLICATIONS

Article entitled "Product Sizing with 3D Anthropometry and K-Medoids Clustering", by Lacko et al., dated Jun. 13, 2017 (Year: 2017).*
Article entitled "Classification Intelligence Analyst 3DExperience Role", by Dassault, Dated 2021 (Year: 2021).*

(Continued)

*Primary Examiner* — Mahesh H Dwivedi
(74) *Attorney, Agent, or Firm* — Oblon, McClelland, Maier & Neustadt, L.L.P.

(57) ABSTRACT

A computer-implemented method for classifying three-dimensional (3D) objects including obtaining a set of 3D objects. Each 3D object of the set has a signature representative of the morphology of the 3D object. The method also includes computing a multi-level clustering of the set of 3D objects. The multi-level clustering is a hierarchical tree structure of clusters of 3D objects of the set and has N hierarchical levels. The method also includes selecting, automatically or upon user interaction, one of the computed clusters of a level of the multi-level clustering thereby defining a current level. The method comprises displaying, to a user, 3D objects of the selected cluster in a first part of a display. The method further includes classifying, upon user interaction, the displayed 3D objects. The computer-implemented method improves the classification of 3D objects.

20 Claims, 17 Drawing Sheets

(56) References Cited

OTHER PUBLICATIONS

Article entitled "Shape-based Clustering for 3D CAD Objects: A Comparative Study of Effectiveness", by Jayanti et al., dated 2009. (Year: 2009).*
Extended Search Report dated May 4, 2021 in Europe Patent Application No. 20306218.7-1224; 14 pgs.
Manuel J. Marin-Jimenez, et al.; "Locating and Segmenting 3D Deformable Objects by Using Clusters of Contour Fragments"; Pattern Recognition and Image Analysis; [Lecture Notes in Computer Science: LNCS]; Springer Berlin Heidelberg, Jun. 6. 2007; XP019094934; ISBN: 978-3-540-72846-7; 8 pgs.
Sadaaki Miyamoto, et al.; "Hierarchical and Non-Hierarchical Medoid Clustering Using Asymmetric Similarity Measures"; 2016 Joint $8^{th}$ International Conference on Soft Computing and Intelligent Systems and 2016 $17^{th}$ International Symposium on Advanced Intelligent Systems (ISIS), IEEE; Aug. 25, 2016; XP033032845; 4 pgs.
Huiyu Zhou, et al.; "Feature Extraction and Clustering for Dynamic Video Summarisation"; Neurocomputing; Elsevier, Amsterdan, NL; vol. 73, Jun. 1, XP027039139; ISSN: 0925-2312; 12 pgs.

* cited by examiner

3D CLUSTERING NAVIGATION

CROSS-REFERENCE TO RELATED APPLICATIONS

This application claims priority under 35 U.S.C. § 119 or 365 to European Application No. 20306218.7, filed Oct. 15, 2020. The entire contents of the above application(s) are incorporated herein by reference.

FIELD

The disclosure relates to the field of computer programs and systems, and more specifically to a method, system and program for classifying a set of three-dimensional (3D) objects.

BACKGROUND

A number of systems and programs are offered on the market for the design, the engineering and the manufacturing of objects. CAD is an acronym for Computer-Aided Design, e.g., it relates to software solutions for designing an object. CAE is an acronym for Computer-Aided Engineering, e.g., it relates to software solutions for simulating the physical behaviour of a future product. CAM is an acronym for Computer-Aided Manufacturing, e.g., it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

More and more products are based on Artificial Intelligence. Thus, it requires, for learning, to set up a standard classification (a systematic grouping of observations into categories) to gather as much as possible information. However, most of the industries did not classified their parts, all the more so on standard taxonomies.

Especially, industries (e.g., automotive industry, aerospace industry) generally rely on computer-aided design software for digitally designing their products before their mass production. CAD users create a lot of digital 3D parts or objects. The 3D parts or objects are generally not well named, that is, the names given by the users lack consistency and/or are not standardized. Thus, massive sets of 3D objects are created but are not properly classified. In this context, a method for massively classifying 3D objects is required.

Since human brain is more efficient to validate very few information at the same time, it is required to "structure" these massive sets of 3D objects for classification validation. Currently, there are three ways for classifying and annotating parts.

The first way is done by humans. To classify and annotate images for creating a huge library of clean annotated images (ImageNet), Google & the Standard University use the Mechanical Turk approach available on Amazon. The principle is simple: they ask to 3 different people to annotate the same image, then, they reconcile the result to enrich the image dataset. Thanks to this approach, they were able to tag more than 14 million of images. However, the main drawback of this first way is that it cannot work in industrial domain, mainly for two reasons. Firstly, because the data may be confidential. Secondly, because the wording in industry is done for specialists: everyone knows what a "cat" is but not a "blind rivet".

The second way is to use attributes. It is the classical way to classify part by using a SQL DB or index engine. It supports huge table (see Google Big table). By combining in the query operators like "AND" or "OR" (in SQL for example), it is quite easy to define a way for classifying parts that have relevant attributes. However, the main drawback of this second way is that very few attributes are interrelated with the shape, so it is very difficult to process massively similar parts.

The third way is to use 3D specifications or 3D signatures. Since these attributes can be missing on the 3D shape, the goal is to find out a way to describe the 3D shape in a single vector (that can be highly dimensional). This vector can be created from two approaches. The first approach is 3D specification (2.a). It is an explicit definition of the part, e.g., a number of holes and their position/orientation, a number of canonics and their equations, . . . that can be extracted by a geometrical algorithm. Once this information is extracted by computation, there are methods to convert this information into a single vector. The second approach is 3D signature (2.b). It is an implicit way to describe the shape. It mainly uses transformation algorithm like Fourier transformation, distance graph between a set of couple of random points on the surfaces, . . . . The output can be transformed into a 1-dimensional vector. Apply metric on this graph is quite easy. Unfortunately, these vectors have a huge dimension and trying to compare component by component is meaningless. Thus, the only way to compare two parts is to define a metric on this signature. At this step (2.a or 2.b), by using Principal Component Analysis or T-SNE, all parts may be displayed in a single window, as illustrated in FIG. 4. However, the main drawback of this third way is that navigating in this kind of tree is a difficult because the information is in fact on a flat level and distinguishing group of parts is not easy at all.

Within this context, there is still a need for an improved computer-implemented method for classifying three-dimensional (3D) objects.

SUMMARY

It is therefore provided a computer-implemented method for classifying three-dimensional (3D) objects. The method comprises providing a set of 3D objects. Each 3D object of the set has a signature representative of the morphology of the 3D object.

The method comprises computing a multi-level clustering of the set of 3D objects. The multi-level clustering is a hierarchical tree structure of clusters of 3D objects of the set and has N hierarchical levels. The computing of the multi-level clustering comprises computing first clusters of the 3D objects of the set. Each first cluster gathers 3D objects of the set having a close signature. The first clusters thus form a first level of the multi-level clustering and are first level nodes of the hierarchical tree structure. The computing of the multi-level clustering comprises computing one or more second clusters of the first clusters. Each second cluster gathers one or more first clusters having a close medoid signature. The one or more second clusters thus form a second level of the multi-level clustering and are second level nodes in the hierarchical tree structure. Each second level node is a parent node of one or more first level nodes. The computing of the multi-level clustering comprises computing, iteratively for each successive hierarchical level k of the multi-level clustering after the second hierarchical level and until the last hierarchical level N is reached, one or more $k^{th}$ clusters of the $(k-1)^{th}$ clusters. Each cluster of the one or more $k^{th}$ clusters gathers one or more $(k-1)^{th}$ clusters having a close medoid signature. The one or more $k^{th}$ clusters are $k^{th}$ level nodes in the hierarchical tree structure and each $k^{th}$ level node is a parent node of one or more $(k-1)^{th}$ level nodes.

The method comprises selecting, automatically or upon user interaction, one of the computed clusters of a level of the multi-level clustering thereby defining a current level. The method comprises displaying, to a user, 3D objects of the selected cluster in a first part of a display. The method comprises classifying, upon user interaction, the displayed 3D objects.

The method may comprise one or more of the following:
- the method may further comprise, prior to the classifying of the displayed 3D objects: selecting, upon user interaction, a new hierarchical level of the multi-level clustering different from the current level, thereby defining a new current level; selecting, automatically or upon user interaction, a new cluster of the new current level that corresponds to a parent node or a children node of the previously selected cluster in the hierarchical tree structure; and displaying, to the user, 3D objects of the selected new cluster in the first part of the display;
- the method may further comprise, prior to the steps of displaying the 3D objects and classifying the displayed objects: displaying, in a second part of the display, a first set of icons, each icon representing a respective level of the multi-level clustering, wherein the selecting, upon user interaction, of the new hierarchical level is performed by selecting one of the displayed icons of the first set, the selected new hierarchical level being the one represented by the selected icon;
- the method may comprise, prior to the steps of displaying the 3D objects and classifying the displayed objects: displaying, in a third part of the display, a second set of icons, each icon of the second set representing a respective cluster of the new current level, wherein the selecting, upon user interaction, of the cluster of the current level is performed by selecting one of the displayed icons of the second set, the selected cluster being the one represented by the selected icon;
- the method may further comprise, repeating: the selecting of one of the computed clusters of the current level of the multi-level clustering, the selected one of the computed clusters of the current level being different from the one previously selected; the displaying of the 3D objects of the selected cluster in the first part of the display; and the classifying of the displayed 3D objects;
- the method may further comprise: selecting a technical domain that the set of 3D objects belongs to; predicting, by a machine learning algorithm, an appropriate level of the multi-level clustering based on the selected technical domain; and defining the predicted appropriate level as being the current level;
- the method may further comprise, for each cluster: determining a medoid 3D object among the 3D objects of the cluster, the medoid 3D object having a signature $S_{medoid}$ that is the closest to a centroid signature of the cluster according to the following formula:

$S_{medoid}$ with medoid=$\operatorname{argmin}_i \|S_i - S_{centroid}\|$, wherein $S_i$ is the signature of each object i of the cluster, $S_{medoid}$ is the signature of the medoid 3D object of the cluster and $S_{centroid}$ is the centroid signature of the cluster, wherein the centroid signature $S_{centroid}$ of the cluster is computed using an average of signatures of 3D objects of the cluster according to the following formula:

$$S_{centroid} = \frac{1}{M} \sum_{i=1}^{M} S_i,$$

where M is the number of 3D objects gathered in the cluster and $S_i$ is the signature of each 3D object i included in the cluster; and wherein the displaying of the 3D objects of the selected cluster in the first part of the display further comprises: computing, for each pair of 3D objects of the set gathered in the cluster, a distance between the 3D objects of the pair on the display that is proportional to the distance between the signatures of the 3D objects of the pair; and placing the 3D objects in the first part of the display by using the computed distance between the 3D objects of the pair on the display, the determined medoid 3D object of the selected cluster is displayed in the center of the first part;

- the displaying the 3D objects of the selected cluster in the first part of the display may further comprise: displaying and automatically selecting all the displayed 3D objects of the selected cluster in a first part of a display. The method may further comprise: unselecting, upon user interaction, at least one of the displayed 3D objects thereby obtaining one or more displayed 3D objects that remain selected; and classifying, upon user interaction, the one or more displayed 3D objects that remain selected;
- the classifying of the displayed 3D object comprises displaying, in a fourth part of the display, a tag input for the displayed 3D objects; and editing and/or validating, upon user interaction on the fourth part, the tag input;
- the method may further comprise predicting a tag for the displayed 3D objects by using a machine learning algorithm and suggesting the predicted tag in the tag input, the machine learning algorithm predicting the tag based on the signatures of the displayed 3D objects;
- each level k of the N successive hierarchical levels is associated with a respective predefined parameter $\varepsilon_k$ such that, for each k from 2 to N, $\varepsilon_{k-1} < \varepsilon_k$. The computing of the first clusters of the 3D objects of the set may further comprise computing first clusters of the 3D objects of the set, each first cluster gathering 3D objects of the set having a close signature such that $\|s_j - S_i\| < \varepsilon_1$, where $S_i$ and $S_j$ are the signatures of any pair i,j of 3D objects gathered in a first cluster, the first clusters thus forming a first level of the multi-level clustering and being first level nodes of the hierarchical tree structure;

The computing of the one or more second clusters may further comprise computing one or more second clusters of the first clusters, each second cluster gathering one or more first clusters having a close medoid signature such that $$\|S_{medoid\ (i)} - S_{medoid\ (j)}\| < \varepsilon_2,$$

where $S_{medoid\ (i)}$ and $S_{medoid\ (j)}$ are the medoid signatures of any pair i,j of first clusters gathered in a second cluster, the one or more second clusters thus forming a second level of the multi-level clustering and being second level nodes in the hierarchical tree structure, each second level node being a parent node of one or more first level nodes; and The computing, iteratively for each successive hierarchical level k of the multi-level clustering after the second hierarchical level and until the last hierarchical level N is reached, of the one or more $k^{th}$ clusters of the $(k-1)^{th}$ clusters may further comprise computing one or more $k^{th}$ clusters, each cluster of the one or more $k^{th}$ clusters gathering one or more $(k-1)^{th}$ clusters having a close medoid signature such that $$\|S_{medoid\ (i)} - S_{medoid\ (j)}\| < \varepsilon_k,$$

where $S_{medoid\ (i)}$ and $S_{medoid\ (j)}$ are the medoid signatures of any pair i,j of $(k-1)^{th}$ clusters gathered in a $k^{th}$ cluster, the one or more $k^{th}$ clusters being $k^{th}$ level nodes in the hierarchical tree structure and each $k^{th}$ level node being a parent node of one or more $(k-1)^{th}$ level nodes; and/or It is further provided a computer program comprising instructions for performing the method.

It is further provided a computer readable storage medium having recorded thereon the computer program.

It is further provided a system comprising a processor coupled to a memory and a graphical user interface, the memory having recorded thereon the computer program.

BRIEF DESCRIPTION OF THE DRAWINGS

Embodiments will now be described, by way of non-limiting example, and in reference to the accompanying drawings, where.

DETAILED DESCRIPTION

Figure 1:
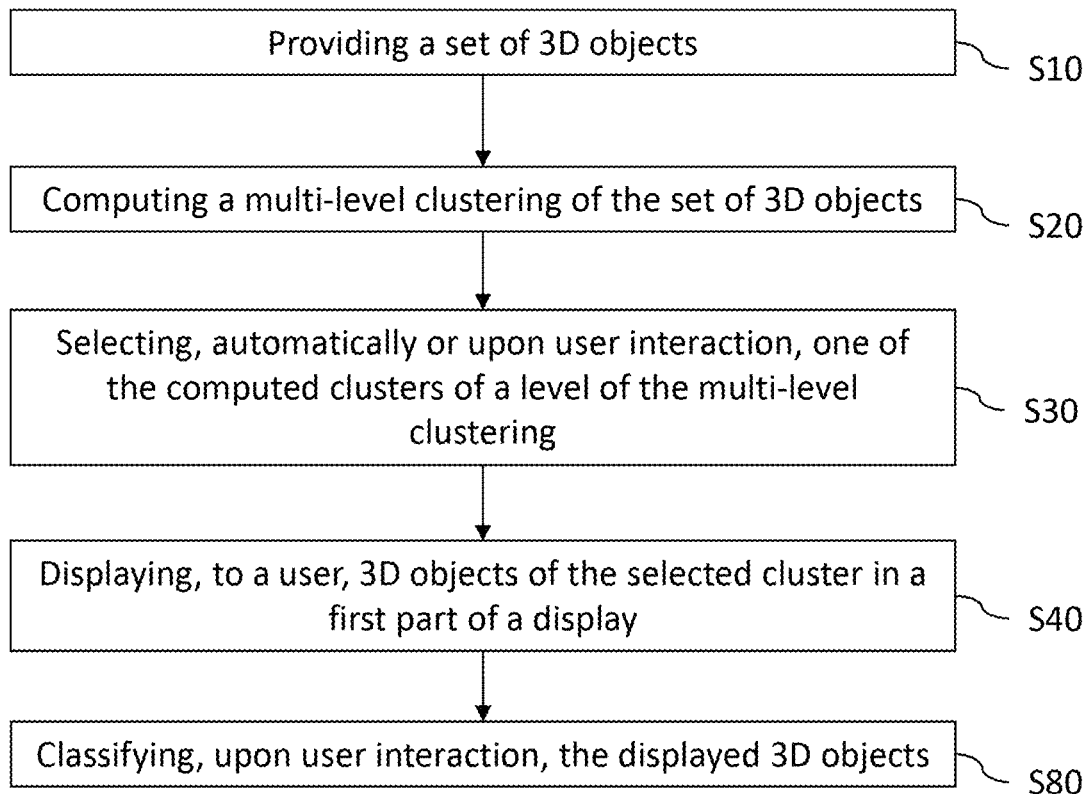
FIGS. 1, 2 and 3 show flowcharts of examples of the method.

With reference to the flowchart of FIG. 1, it is proposed a computer-implemented method for classifying three-dimensional (3D) objects. The method comprises providing S10 a set of 3D objects wherein each 3D object of the set has a signature representative of the morphology of the 3D object. The "morphology of a 3D object" refers to the shape (the term form is also synonymous of shape) and the structure of the 3D object and may further refer to one or more specific structural features of the 3D object. The structure of the 3D object (e.g., an assembly of parts) may be the product structure, e.g. a tree structure. The morphology defines a configuration of the external structure. The morphology is a set of features that defines the external structure of the 3D object.

The method comprises computing S20 a multi-level clustering of the set of 3D objects. The multi-level clustering is a hierarchical tree structure of clusters of 3D objects of the set and has N hierarchical levels.

Figure 2:
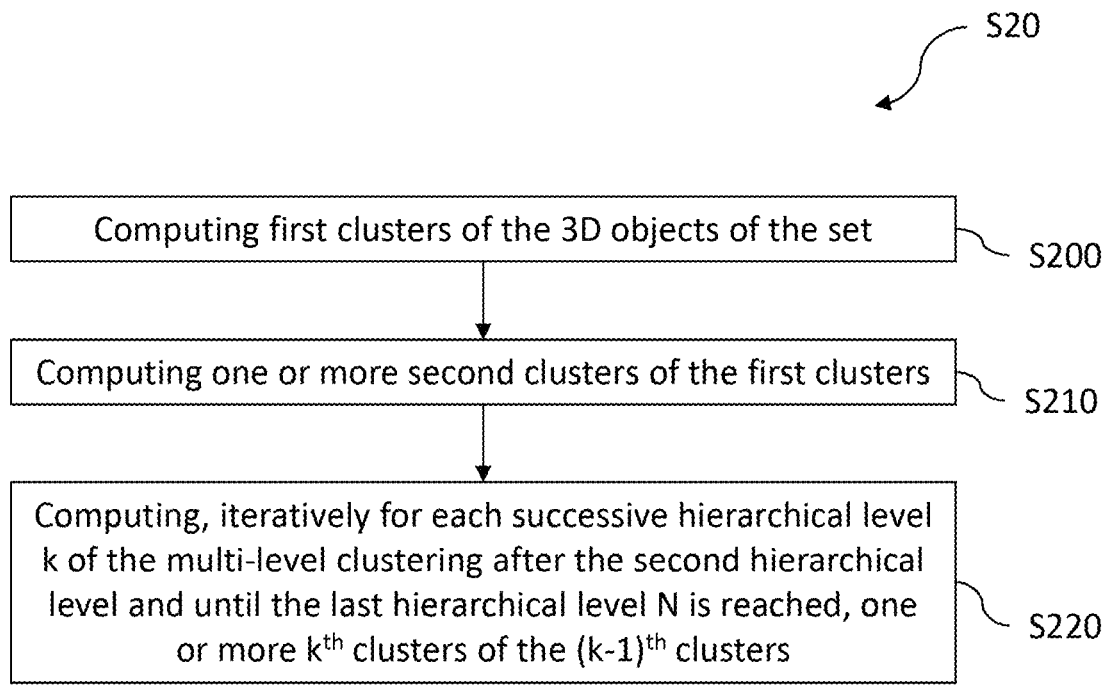

The computing S20 is performed as depicted by the flowchart of FIG. 2. The computing of the multi-level clustering comprises computing S200 first clusters of the 3D objects of the set. Each first cluster gathers 3D objects of the set having a close signature. The first clusters thus form a first level of the multi-level clustering and are first level nodes of the hierarchical tree structure. The computing of the multi-level clustering S20 further comprises computing S210 one or more second clusters of the first clusters. Each second cluster gathers one or more first clusters having a close medoid signature. The one or more second clusters thus form a second level of the multi-level clustering and are second level nodes in the hierarchical tree structure. Each second level node is a parent node of one or more first level nodes. The computing of the multi-level clustering also comprises computing S220, iteratively for each successive hierarchical level k of the multi-level clustering after the second hierarchical level and until the last hierarchical level N is reached, one or more $k^{th}$ clusters of the $(k-1)^{th}$ clusters. Each cluster of the one or more $k^{th}$ clusters gathers one or more $(k-1)^{th}$ clusters having a close medoid signature. The one or more $k^{th}$ clusters are $k^{th}$ level nodes in the hierarchical tree structure and each $k^{th}$ level node is a parent node of one or more $(k-1)^{th}$ level nodes.

Referring again to the flowchart of FIG. 1, the method comprises selecting S30, automatically or upon user interaction, one of the computed clusters of a level of the multi-level clustering thereby defining a current level. The method comprises displaying S40, to a user, 3D objects of the selected cluster in a first part of a display. The method comprises classifying S80, upon user interaction, the displayed 3D objects. Classifying is identifying to which of a set of categories (or sub-populations) the displayed 3D objects belong. Classifying can consist of assigning a given category (e.g. assigned to a word such as a tag) to the displayed 3D objects, thereby registering that the displayed 3D objects belong to the category of the tag.

The computer-implemented method improves the way a user can classify massive sets of 3D objects. Notably, the set of 3D objects to be classified is clustered and the clusters are displayed to the user who can select one of the clusters. Most of the clusters comprise several 3D objects, and the user can classify the 3D objects of the selected cluster at the same time. This improves the efficiency of the classification since the computer implemented method assists the user to carry out the classification. The user no longer inspects each 3D object individually. The classification is carried out by considering clusters that gather groups of 3D objects. The user can with one single click annotate all the 3D objects of the cluster. Less clicks are thus required for an equivalent result, and the classification of all the 3D objects is performed more quickly.

Moreover, the clusters are created from the computing of the multi-level clustering of the set of 3D objects, thus forming a hierarchical tree structure of the clusters with N hierarchical levels. This hierarchical organization of the 3D objects improves the classification of the 3D objects. In particular, the 3D objects are gathered based on a signature representative of the morphology. Each cluster thus gathers 3D objects having a similar morphology, and the 3D objects that belong to a cluster are thus more inclined to be classified together. The user is therefore assisted in a particularly effective way.

Furthermore, the multi-level clustering is computed such that 3D objects gathered in a cluster of a given level are also gathered in a same cluster for any higher hierarchical level. Indeed, except for the first level, the clusters are computed based on medoid signatures of lower-level clusters (and not signatures of 3D objects). Thus, groups of clusters of 3D objects are considered when a higher hierarchical level is computed. This allows forming a hierarchical tree structure that comprises children nodes and parent nodes, each parent node gathering 3D objects of one or more children nodes in the lower hierarchical level. The consistency of the grouping in clusters is thus particularly important in the tree structure thus formed. The computing of the multi-level clustering therefore improves the classification efficiency since consistent clusters of 3D objects are formed.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system. The system may comprise a processor coupled to a memory and a display, the memory having recorded thereon a computer program comprising instructions for performing the method. The display may be a graphical user interface (GUI). The memory may also store a database. The memory is any hardware adapted for such storage, possibly comprising several physical distinct parts (e.g., one for the program, and possibly one for the database).

By "database", it is meant any collection of data (i.e. information) organized for search and retrieval (e.g. a relational database, e.g. based on a predetermined structured language, e.g. SQL). When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

The method allows classifying a set of three-dimensional (3D) objects. A 3D object (or 3D modelled object) is any object defined by data stored e.g. in the database. By extension, the expression "3D object" designates the data itself. According to the type of the system, the 3D object may be defined by different kinds of data. The system may indeed be any combination of a CAD system, a CAE system, a CAM system, a PDM system and/or a PLM system. In those different systems, 3D objects are defined by corresponding data. One may accordingly speak of CAD object, PLM object, PDM object, CAE object, CAM object, CAD data, PLM data, PDM data, CAM data, CAE data. However, these systems are not exclusive one of the other, as a 3D object may be defined by data corresponding to any combination of these systems. A system may thus well be both a CAD and PLM system, as will be apparent from the definitions of such systems provided below.

By CAD system, it is additionally meant any system adapted at least for designing a 3D object on the basis of a graphical representation of the 3D object, such as CATIA. In this case, the data defining a 3D object comprise data allowing the representation of the 3D object. A CAD system may for example provide a representation of CAD 3D object using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a 3D object may be stored in a single CAD file or multiple ones. The typical size of a file representing a 3D object in a CAD system is in the range of one Megabyte per part. And a 3D object may typically be an assembly of thousands of parts.

In the context of CAD, a 3D object may represent a product such as a part or an assembly of parts, or possibly an assembly of products, or an assembly of products structured as a tree structure. By "3D object", it is meant any object which is modeled by data allowing its 3D representation. A 3D representation allows the viewing of the part from all angles. For example, a 3D object, when 3D represented, may be handled and turned around any of its axes, or around any axis in the screen on which the representation is displayed. This notably excludes 2D icons, which are not 3D modeled. The display of a 3D representation facilitates design (i.e., increases the speed at which designers statistically accomplish their task). This speeds up the manufacturing process in the industry, as the design of the products is part of the manufacturing process.

The 3D object may represent the geometry of a product to be manufactured in the real world subsequent to the completion of its virtual design with for instance a CAD software solution or CAD system, such as a (e.g., mechanical) part or assembly of parts (or equivalently an assembly of parts, as the assembly of parts may be seen as a part itself from the point of view of the method, or the method may be applied independently to each part of the assembly), or more generally any rigid body assembly (e.g., a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D object designed by the method may thus represent an industrial product which may be any mechanical part, such as a part of a terrestrial vehicle (including e.g., car and light truck equipment, racing cars, motorcycles, truck and motor equipment, trucks and buses, trains), a part of an aerial vehicle (including e.g., airframe equipment, aerospace equipment, propulsion equipment, defense products, airline equipment, space equipment), a part of a naval vehicle (including e.g., navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

A CAD system may be history-based. In this case, a 3D object is further defined by data comprising a history of geometrical features. A 3D object may indeed be designed by a physical person (i.e., the designer/user) using standard modeling features (e.g., extrude, revolute, cut, and/or round) and/or standard surfacing features (e.g., sweep, blend, loft, fill, deform, and/or smoothing). Many CAD systems supporting such modeling functions are history-based system. This means that the creation history of design features is typically saved through an acyclic data flow linking the said geometrical features together through input and output links. The history based modeling paradigm is well known since the beginning of the 80's. A 3D object is described by two persistent data representations: history and B-rep (i.e., boundary representation). The B-rep is the result of the computations defined in the history. The shape of the part displayed on the screen of the computer when the 3D object is represented is (e.g. a tessellation of) the B-rep. The history of the part is the design intent. Basically, the history gathers the information on the operations which the 3D object has undergone. The B-rep may be saved together with the history, to make it easier to display complex parts. The history may be saved together with the B-rep in order to allow design changes of the part according to the design intent.

By PLM system, it is additionally meant any system adapted for the management of a 3D object representing a physical manufactured product (or product to be manufactured). In a PLM system, a 3D object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

By CAE solution, it is additionally meant any solution, software of hardware, adapted for the analysis of the physical behavior of a 3D object. A well-known and widely used CAE technique is the Finite Element Method (FEM) which typically involves a division of a 3D object into elements which physical behaviors can be computed and simulated through equations. Such CAE solutions are provided by Dassault Systèmes under the trademark SIMULIA®. Another growing CAE technique involves the modeling and analysis of complex systems composed a plurality components from different fields of physics without CAD geometry data. CAE solutions allow the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

The method comprises providing S10 a set of 3D objects. The set of 3D objects may be any set of 3D objects. The set of 3D objects may be e.g. a set of 3D objects stored in a database. The provision S10 may be performed according to any method. For instance, the set of 3D objects may be stored on a memory and the user may select the memory location where the set of 3D objects is stored. Alternatively, the providing S10 of a set of 3D objects may also be performed by downloading, upon user interaction, the set of 3D objects in a predetermined location of the memory. The memory may be any type of memory, therefore including a database. The database may be a relational database. Alternatively or additionally, the database may be a non-volatile memory storage.

Each 3D object in the database is associated to a signature. The signature is a unique identifier for a given 3D object and includes information on the shape (or form) and the structure of the 3D object. The signature may further refer to one or more specific structural features of the 3D object. The signature can be used as an input for a database indexer. The signature is computed from values representing at least one of the morphology of the 3D object. A value representing the morphology may be a value quantifying said morphology. The values may be numerical values. The values may be included in the signature. The term "quantifying" means an information which can be ordered on a scale in a deterministic manner, such as a numerical value ordered in a numerical scale (e.g., with the help of an axis system). The values quantifying the morphology may be ordered in respective space which allows for an analytic assessment of similarity, for example based on the differences between the values for each respective feature space. The combined values quantifying the different morphology, thus allow an analytic assessment of similarity between 3D objects. The signature is computed from values representing the morphology but may additionally also be computed from other features related to the 3D object.

In examples, the appearance signature may be a vector comprising a concatenation of values representing the morphology of the 3D object. The values representing the 3D object may include numerical values in the form of numbers, vectors and/or matrices. In examples, the signature of a 3D object is a fixed-size vector that defines the morphology of the 3D object.

The providing S10 of the set of 3D objects may comprise providing the signatures of the 3D objects of the set at the same time as the set of 3D objects. Alternatively, the method may comprise, after the providing S10 of the set of 3D objects, computing a signature for each 3D object of the provided set.

The computing of signature may be any combinations of transformations of the 3D object into a fixed-size vector.

In examples, the transformation may consist in embedding the 3D shape of the 3D object. The transformation may be any combination of 3-dimension reduction techniques that allows to transform any 3D object into a fixed-size vector. In that case, the signature may be e.g. a 416-long floats vector. An example of 3-dimension reduction technique is String Histogram, wherein a histogram of the length of the strings in the 3D object is computed. Another example of 3-dimension reduction technique is D2 shape distribution, consisting of a normalized histogram of distance occurrence probabilities between two randomly chosen points on the 3D object. Another example of 3-dimension reduction technique is Hough 3D Descriptor, consisting of main plans parameters of the tringles in the 3D object. Another example of 3-dimension reduction technique is 3D shape spectrum descriptor, consisting of local curves on the surface of the 3D object. Another example of 3-dimension reduction technique is Extended Gaussian Images, consisting of projections of the triangulation of the 3D object on spheres cut into small faces.

In other examples, the transformation may also consist in embedding the semantic of the 3D object. The transformation may be any TF-IDF (term frequency-inverse document frequency) algorithm. The TF-IDF algorithm may be fitted on a selected data set in order to convert any semantic field contained in metadata of the 3D object into a fixed-size vector. In that case, the signature may be e.g. a 500-long floats vector.

The computing of the signature may use any of these transformations alone or both concatenated.

The method comprises computing S20 a multi-level clustering of the set of 3D objects. The multi-level clustering is a hierarchical tree structure of clusters of 3D objects of the set and has N hierarchical levels. The tree structure represents the hierarchical nature of the multi-level clustering in a graphical form. The tree structure comprises tree elements called "nodes" and lines connecting elements called "branches". A parent node is a node one step higher in the hierarchy (i.e. closer to the root node) and lying on the same branch. Inversely, a children node is a node one step lower in the hierarchy. In the tree structure, a node has only one parent node. However, a node has one or more children nodes. Sibling nodes are nodes that share a same parent node. The tree structure may be finite. In that case, the tree structure has a member that has no superior. This member is called the root node. The root node is the starting node. Alternatively, the tree structure may be infinite. In that case, the tree structure has no root node.

The computing of the multi-level clustering comprises computing S200 first clusters of the 3D objects of the set. The first clusters form a first level of the multi-level clustering. The first clusters are first level nodes of the hierarchical tree structure. In the hierarchical tree structure, the first clusters are nodes without children. The first clusters are called leaf nodes.

Each first cluster gathers 3D objects of the set having a close signature. This means that distances between each pair of 3D objects of a first cluster are small. The distances between each pair of 3D objects of a first cluster may be lower than a predetermined parameter. Each 3D object is thus assigned to a first cluster that may gather one or more other 3D objects having signatures that are close to the signature of the 3D object. Signatures of 3D objects gathered in a same first cluster are thus similar, i.e., have small distances between them. A first cluster may also gather only one 3D object, for instance if no other 3D object of the set has a signature that is close to the signature of the 3D object.

The computing of the multi-level clustering comprises computing S210 one or more second clusters of the first clusters. Each second cluster gathers one or more first clusters having a close medoid signature. A medoid 3D object (or "medoid") of a cluster is a 3D object gathered in the cluster whose average dissimilarity to all others 3D objects gathered in the cluster is minimal. For instance, the dissimilarity with others 3D objects may be appreciated based on the distances between signatures of others 3D objects. The medoid 3D object of the cluster may be determined based on a computation of a centroid signature of the cluster. The centroid signature may be an average of signatures of 3D objects gathered in the cluster. The signature of the medoid 3D object of the cluster is called the "medoid signature" of the cluster. Each first cluster is thus assigned to a second cluster that may gather one or more other first clusters having medoid signatures that are close to the medoid signature of the first cluster. Medoid signatures of first clusters gathered in a same second cluster are thus similar, i.e., have small distances between them. This implies that signatures of 3D objects gathered in a same second cluster are also similar. This also implies that 3D objects gathered in a first cluster are also gathered in a same second cluster. This improves the consistency of structure in the multi-level clustering. The one or more second clusters thus form a second level of the multi-level clustering. The one or more second clusters are second level nodes in the hierarchical tree structure. Each second level node is a parent node of one or more first level nodes. In the hierarchical tree structure, a second cluster may gather several first clusters. In that case, the second cluster is the parent node of these several first clusters. These several first clusters are children nodes. A second cluster may also gather only one first cluster, for instance if no other first clusters has a medoid signature that is close to the medoid signature of the considered first cluster. In that case, the second cluster is the parent node of this single first clusters, which is the unique children node of this second cluster.

The computing of the multi-level clustering comprises computing S220, iteratively for each successive hierarchical level k of the multi-level clustering after the second hierarchical level and until the last hierarchical level N is reached, one or more $k^{th}$ clusters of the $(k-1)^{th}$ clusters. For instance, the computing of the multi-level clustering may comprise successively computing one or more third clusters, one or more fourth clusters, . . . , until finally computing one or more $N^{th}$ clusters. For each hierarchical level k, each cluster of the one or more $k^{th}$ clusters gathers one or more $(k-1)^{th}$ clusters having a close medoid signature. The one or more $k^{th}$ clusters are $k^{th}$ level nodes in the hierarchical tree structure. Each $k^{th}$ level node is a parent node of one or more $(k-1)^{th}$ level nodes.

Thus, each $(k-1)^{th}$ cluster is assigned to a $k^{th}$ cluster that may gather one or more other $(k-1)^{th}$ clusters having medoid signatures that are close to the medoid signature of the $(k-1)^{th}$ cluster. Medoid signatures of $(k-1)^{th}$ clusters gathered in a same $k^{th}$ cluster are thus similar, i.e. have small distances between them. This implies that signatures of 3D objects gathered in a $k^{th}$ cluster are also similar. This also implies that 3D objects gathered in a $(k-1)^{th}$ cluster are also gathered in a same $k^{th}$ cluster. This improves the consistency of structure in the multi-level clustering. The one or more $k^{th}$ clusters thus form a $k^{th}$ level of the multi-level clustering. The one or more second clusters are $k^{th}$ level nodes in the hierarchical tree structure. Each $k^{th}$ level node is a parent node of one or more $(k-1)^{th}$ level nodes. In the hierarchical tree structure, a $k^{th}$ cluster may gather several $(k-1)^{th}$ clusters. In that case, the $k^{th}$ cluster is the parent node of these several first clusters. These several $(k-1)^{th}$ clusters are children nodes. A $k^{th}$ cluster may also gather only one $(k-1)^{th}$ cluster, for instance if no other $(k-1)^{th}$ clusters has a medoid signature that is close to the medoid signature of the considered $k^{th}$ cluster. In that case, the $k^{th}$ cluster is the parent node of this single $(k-1)^{th}$ clusters, which is the unique children node of this $k^{th}$ cluster.

The method comprises selecting S30, automatically or upon user interaction, one of the computed clusters of a level of the multi-level clustering thereby defining a current level. The selecting S30 may be performed automatically. In this case, the method may select a predetermined level as the current level. The predetermined level may be a recorded parameter or a default parameter. After selecting a level, the method may select one of the clusters of the selected level. The selecting of one of the clusters may be performed automatically, for instance, the clusters of the level may be hierarchically organized, and the method may select the first of the clusters of the level. The method may also randomly select one of the clusters of the level.

Alternatively, the selecting S30 may be performed upon user interaction. For instance, the user may select one of the clusters of a level with a pointing device or via a touch when the display is a touch screen. The user may interact with a graphical representation of the hierarchical tree structure. The graphical representation may comprise elements representing the nodes and the branches of the hierarchical tree structure. The user may select one of the nodes or one of the branches, thereby selecting a cluster or a level. The user may also select one cluster of a predetermined level. For instance, the predetermined level may be a recorded parameter or a default parameter. In this case, the graphical representation may comprise only elements representing clusters of the predetermined level.

It is to be understood that several subsequent selections may be carried out at S30. In an example, a default cluster of one of the levels of the multi-level clustering may be automatically selected, and the user can then perform one or several selections of clusters until the user is satisfied by their choice.

The method comprises displaying S40, to a user, 3D objects of the selected cluster in a first part of a display. A part of the display is a predetermined portion of the surface of the display. The surface of the display may e.g., be subdivided, and the first part may be one of the subdivisions of the display. The display may comprise several parts and the first part may be the main part of the display. The main part may be the largest of the parts of the display. The displayed 3D objects may be distributed on the first part. The distribution of the displayed 3D objects may be homogeneous on a portion of the first part. The distribution of the displayed 3D objects may be organized on the portion according to the user. For instance, one or more of the displayed 3D objects may be in the center of the portion of the first part. Others may be in the periphery of the portion. For instance, others may be displayed around the one or more 3D objects displayed in the center of the portion of the first part. The displayed 3D objects may not superimpose each other on the first part. The 3D objects may be displayed with a similar point of view, a similar scale and/or a similar design (color, line thickness, graphic conventions, . . . ), i.e. the camera is at a same relative position with a same relative orientation for all of the displayed 3D objects.

The method comprises classifying S80, upon user interaction, the displayed 3D objects. The user may classify all the displayed 3D objects at the same time. For instance, the user may perform a single user interaction to classify all the displayed 3D objects. The user may also classify a part of the displayed 3D objects at the same time. In this case, the method may comprise classifying a selected part of the displayed 3D objects. The classifying S80 of the displayed 3D objects may comprise assigning a tag or validating a predicted tag to the displayed 3D objects. A tag is a keyword or term associated or assigned to information, which describes a characteristic of the 3D object. The tag allows an easy grouping of information containing the same keywords. Keywords or terms may be taken from a dictionary or an industry standard. The industry standard may be the industry standard eCl@ss.

The computer-implemented method improves the classification of 3D objects. Indeed, the method allows the user to classify several displayed 3D objects at the same time. The user is well assisted to classify the displayed 3D objects. In particular, the classification is carried out by considering clusters that gather groups of 3D objects. These clusters are created from the computing of the multi-level clustering of the set of 3D objects. This hierarchical organization of the 3D objects improves the classification of the 3D objects. Indeed, the 3D objects are gathered based on a signature representative of the morphology and each cluster thus gathers 3D objects having a similar morphology. These 3D objects are thus more inclined to be classified together, which effectively assists the user during the classification. Furthermore, the tree structure formed improves the consistency of the grouping in clusters. The computing of the multi-level clustering therefore improves the classification efficiency since consistent clusters of 3D objects are formed and displayed together to the user. Notably, in the field of User Experience (UX), it is commonly admitted that only few information at once, for example three to four, has to be presented in order to help the user's analyze. This principle is recognized in the field of UX. Clusters containing almost identical 3D objects are formed during the computing of the multi-level clustering. Thus, the multi-level clustering makes tagging easier since 3D objects should have the same tag in a given cluster.

Figure 3:
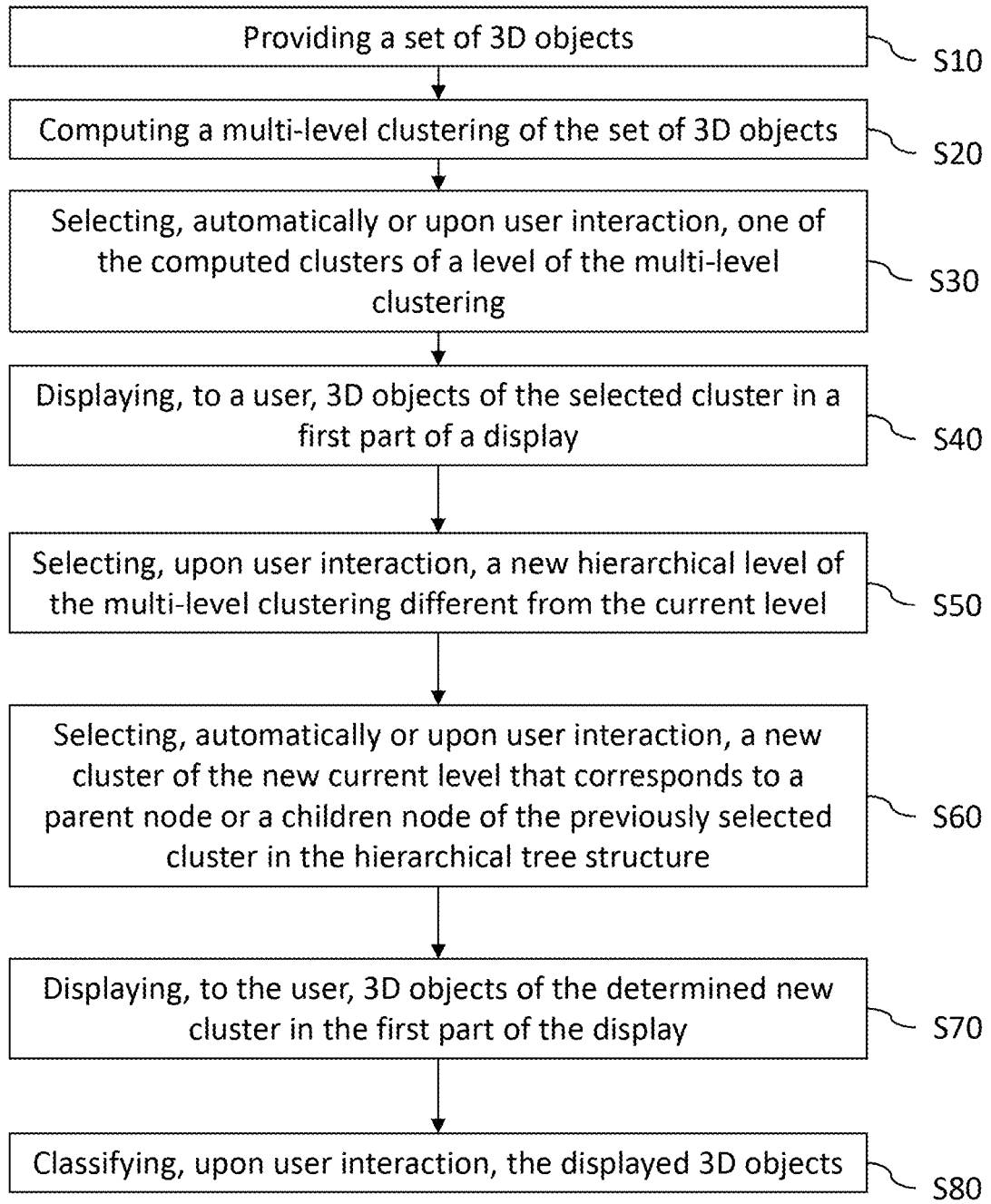
Figure 4:
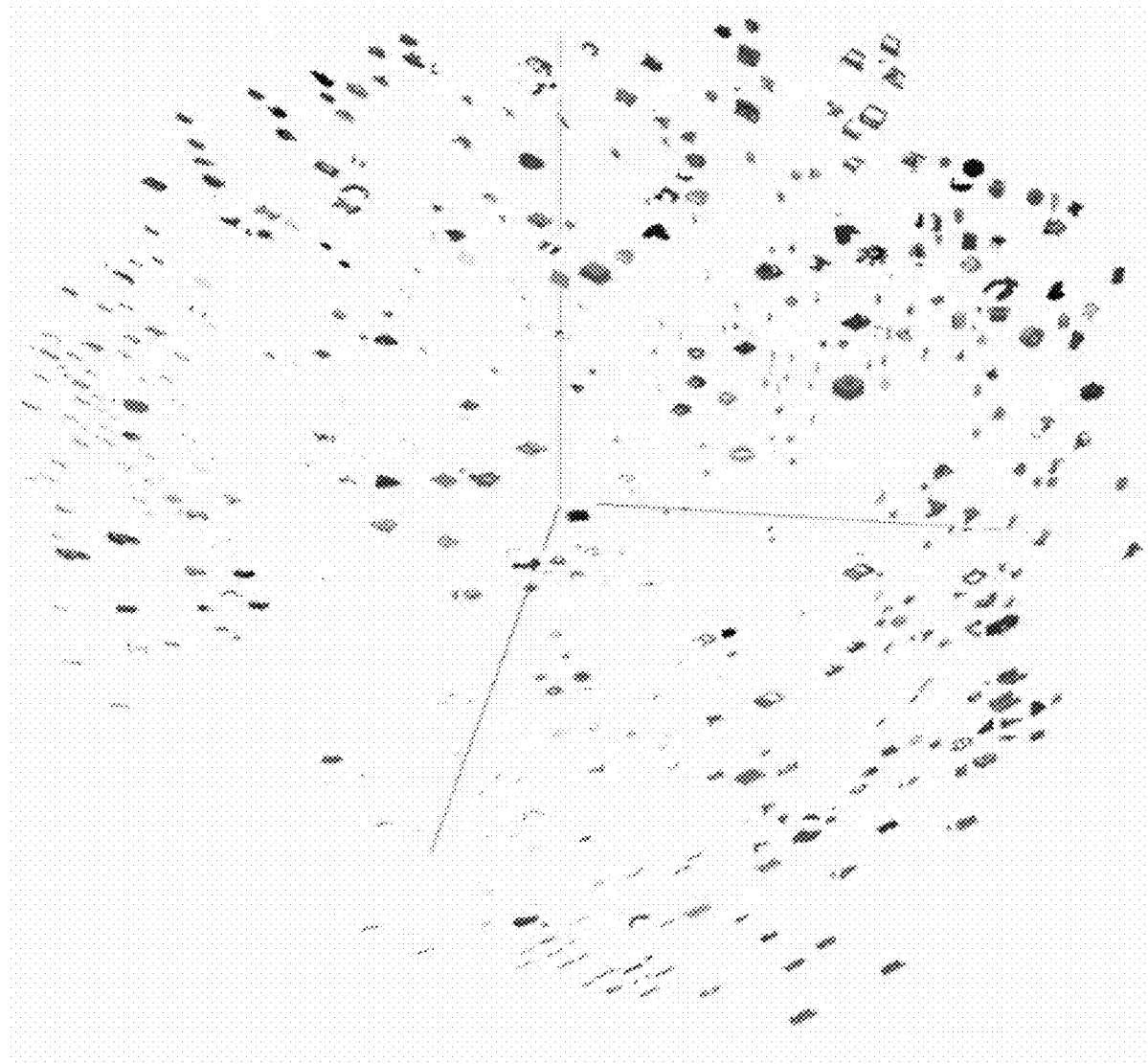
FIG. 4 shows an example of 3D objects displayed in a single window.

With reference to the flowchart of FIG. 3, the method may further comprise, prior to the classifying of the displayed 3D objects, selecting S50, upon user interaction, a new hierarchical level of the multi-level clustering different from the current level, thereby defining a new current level. The selecting S50 of the new hierarchical level may comprise detecting a user interaction with a graphical element displayed on the display that represents the new hierarchical level. For instance, the method may comprise displaying the hierarchical tree structure, e.g. displaying an element representing each of the hierarchical level. The user may select one of the displayed elements, thereby selecting the hierarchical level represented by the selected element.

The method may further comprise, prior to the classifying of the displayed 3D objects, selecting S60, automatically or upon user interaction, a new cluster of the new current level that corresponds to a parent node or a children node of the previously selected cluster in the hierarchical tree structure.

It is to be understood that several subsequent selections may be carried out at S60. In an example, a new cluster of a new level of the multi-level clustering may be automatically selected, and the user can then perform one or several selections of clusters until the user is satisfied by their choice.

The new current level may be a higher hierarchical level. In this case, the method may select, automatically, a parent node of the previously selected cluster in the hierarchical tree structure. For instance, the method may follow the hierarchical tree structure to identify the node of the new current level that is the parent node of the previously selected cluster. Indeed, each node of the hierarchical tree structure comprises a single parent node only (except nodes of the last hierarchical level, but if the current level is the last hierarchical level, the new current level cannot be a higher hierarchical level).

The new current level may also be a lower hierarchical level. In this case, the method may select, automatically, one of the children nodes of the previously selected cluster in the hierarchical tree structure. For instance, the method may select randomly one of the children nodes. The method may also select the children node having the highest number of 3D objects. Alternatively, the selection of one of the children nodes may be performed upon user interaction. For instance, the method may propose the children nodes to the user and the user may select one of the proposed children nodes.

The method may further comprise, prior to the classifying of the displayed 3D objects, displaying S70, to the user, 3D objects of the selected new cluster in the first part of the display. The displaying S70 of the 3D objects of the determined new cluster may comprise removing the 3D objects of the previously selected cluster that are displayed in the first part prior to displaying S70 the 3D objects of the determined new cluster. The displaying S70 of the 3D objects of the determined new cluster may be performed according to the displaying S40 of the 3D objects of the previously selected cluster.

The selecting S50 of the new hierarchical level improves the classification of 3D objects. Indeed, it allows having a finer or coarser granularity during the classification. The user may select a higher hierarchical level of the tree structure to classify a greater number of 3D objects at the same time (since parent clusters contain more 3D objects). The user may also select a lower hierarchical level of the tree structure to classify a lower number of 3D objects at the same time (children clusters contain less 3D objects). For instance, if the user considers that too many 3D objects are displayed, the user may reduce the number of displayed 3D objects by selecting a lower hierarchical level. This allows having a finer granularity since children nodes have a number of 3D objects that is equal or lower or strictly lower. Moreover, because the clusters are computed based on the signature, the 3D objects of children nodes are more likely to be classified together. It therefore facilitates the classification for the user, how can adapt the hierarchical level he or she uses.

In examples, the method may further comprise, prior to the steps of displaying the 3D objects and classifying the displayed objects, displaying, in a second part of the display, a first set of icons. Each icon represents a respective level of the multi-level clustering. An icon is a small pictogram representing a respective level (such as e.g., a bar, a circle, a cube, . . . ). The position of the icons of the first set may be organized on the second part of the display. The icons of the first set may be aligned according to the hierarchical tree structure. The order of the aligned successive icons may be the same as that of the levels in the hierarchical tree structure. The icon of the first set representing the current level may be highlighted. The icon of the current level may be displayed with a different color.

The selecting, upon user interaction, of the new hierarchical level may be performed by selecting one of the displayed icons of the first set. The selected new hierarchical level may be the one represented by the selected icon. For instance, the user may interact with one of the displayed icons of the first set by using a pointing device or via a touch when the display is a touch screen.

The selecting of the new hierarchical level based on the displayed first set of icons improves the ergonomics for the user. Indeed, the user can select a new hierarchical level directly on one of the displayed first set of icons. The display of the first set of icons in the second part of the display also provides an overview of the hierarchical tree structure for the user; this overview is also referred to as "bird eye". The user can appreciate on which hierarchical level he or she is currently working and whether he want to go up or down a level in the hierarchical tree structure. This further improves the ergonomics for the user during the classification.

In examples, the method may comprise, prior to the steps of displaying the 3D objects and classifying the displayed objects, displaying, in a third part of the display, a second set of icons. Each icon of the second set represents a respective cluster of the new current level. As for the first set of icons, the position of the icons of the second set may be organized on the third part of the display. The icons of the second set may be aligned. For instance, the icons of the second set may be aligned according to the number of 3D objects that each cluster gathers. The icon of the second set representing the currently selected cluster may be highlighted. The icon of the currently selected cluster may be displayed with a different color.

The selecting, upon user interaction, of the cluster of the current level may be performed by selecting one of the displayed icons of the second set. The selected cluster may be the one represented by the selected icon. For instance, the user may interact with one of the displayed icons of the second set by using a pointing device or via a touch when the display is a touch screen.

The selecting of the cluster based on the displayed second set of icons improves the ergonomics for the user. Indeed, the user can select a cluster level directly on one of the displayed second set of icons. The display of the second set of icons in the third part of the display also provides an overview of the clusters of the current level. The user can appreciate on which cluster he or she is currently working and whether he want to go to another cluster of the current level. This further improves the ergonomics for the user during the classification.

In examples, the method may further comprise repeating the selecting of one of the computed clusters of the current level of the multi-level clustering. For each repetition, the selected one of the computed clusters of the current level may be different from the one previously selected. For each newly selected cluster, the method may comprise repeating the displaying of the 3D objects of the newly selected cluster in the first part of the display. After each new display of the 3D objects of the newly selected cluster, the method may further comprise repeating the classifying of the displayed 3D objects. The repetition may end when all clusters of the current level have been displayed and classified by the user. When the selection of one of the computed clusters is performed automatically, the selection may be performed according to an order of the clusters of the current level.

The repetition allows the user to successively classify 3D objects of clusters on the same hierarchical level (the current level). It therefore improves the efficiency of the classification by the user.

In examples, the method may further comprise selecting a technical domain that the set of 3D objects belongs to. A technical domain is a grouping of objects sharing common characteristics. The selected technical domain may be a technical domain that most of the 3D objects of the set share. The method may further comprise predicting, by a machine learning algorithm, an appropriate level of the multi-level clustering based on the selected technical domain. The method may further comprise defining the predicted appropriate level as being the current level.

The machine learning algorithm may any machine learning algorithm. The machine learning algorithm may be trained on collected user preferences data. The machine learning algorithm may take as input the multi-level clustering and the selected technical domain. The machine learning algorithm may output an appropriate level.

The machine learning algorithm improves the efficiency of the classification. Indeed, the machine learning algorithm predicts an appropriate level based on the selected technical domain. The level on which the user is working is therefore directly appropriate.

The method may further comprise, for each cluster, determining a medoid 3D object among the 3D objects of the cluster. The medoid 3D object may have a signature that is the closest to a centroid signature of the cluster. The medoid 3D object may have a signature $S_{medoid}$ that may be determined according to the following formula:

$$S_{medoid} \text{ with medoid} = \operatorname{argmin}_i \|S_i - S_{centroid}\|,$$

wherein $S_i$ is the signature of each object i of the cluster, $S_{medoid}$ is the signature of the medoid 3D object of the cluster and $S_{centroid}$ is the centroid signature.

In this formula as well as for all the others, the norm $\| \ldots \|$ may be any norm that measures a length of a vector. The norm may be e.g., the Manhattan norm. The Manhattan norm is the sum of the absolute values of columns of the vector. The distance between signatures may be a Manhattan distance between the signatures. The distance between two signatures $S_i$ and $S_j$ may be computed based on the Manhattan norm of the difference between the two signatures $\|S_j - S_i\|$.

The norm of the vector $S_i - S_{centroid}$ represents a distance between the signature $S_i$ of each object i of the cluster and the centroid signature $S_{centroid}$ of the cluster. The medoid 3D object is the 3D object having the minimal norm with the centroid. The computing of the 3D object having the minimum norm with the centroid (argmin) therefore allows determining the medoid 3D object. The method may comprise computing each norm $\|S_i - S_{centroid}\|$ for each 3D object i of the cluster and determining argmin the 3D object having the minimum of the computed norms, the medoid 3D object being the 3D object having the minimum norm.

The centroid signature $S_{centroid}$ of the cluster may be computed using an average of signatures of 3D objects of the cluster. The centroid signature $S_{centroid}$ of the cluster may be computed according to the following formula:

$$S_{centroid} = \frac{1}{M}\sum_{i=1}^{M} S_i$$

where M is the number of 3D objects gathered in the cluster and $S_i$ is the signature of each 3D object i gathered in the cluster.

The displaying of the 3D objects of the selected cluster in the first part of the display may further comprise computing, for each pair of 3D objects of the set gathered in the cluster, a distance between the 3D objects of the pair on the display that is proportional to the distance between the signatures of the 3D objects of the pair. The distance may be computed using the Manhattan norm. For instance, the method may comprise computing, for each pair i,j of 3D objects of the set gathered in the cluster, the norm of the difference of signatures of the pair $\|S_j - S_i\|$ and may store the computed norms. The displaying of the 3D objects of the selected cluster in the first part of the display may further comprise placing the 3D objects in the first part of the display by using the computed distance between the 3D objects of the pair on the display. The determined medoid 3D object of the selected cluster may be displayed in the center of the first part.

The displaying of the 3D objects of the selected cluster in the first part of the display may comprise displaying the 3D objects in a 2D Bubble representation. The 2D Bubble representation is a 2D graph comprising bubbles representing the 3D objects, wherein the distance between two bubbles (i.e., a disk for each 3D object) is proportional to a similarity rate (e.g., the norm between the signatures of the two 3D objects represented by the two bubbles). The method may use D3.js graph component to display the 2D Bubble representation. This component tries to respect the distances between 3D objects by minimizing an energy.

The selecting, upon user interaction, of a new hierarchical level of the multi-level clustering different from the current level may be based on the 2D Bubble representation. For instance, the user may position the pointing device on a bubble of the 2D Bubble representation representing a given cluster and scroll up or down a wheel, thereby selecting one of the children nodes or the parent of the given cluster.

The use of the medoid signature improves the computing of the hierarchical tree structure. Indeed, clusters are formed based on the signature of the medoid, which is the 3D object having the closest signature to the centroid signature. The medoid signature thus allows computing a hierarchical tree structure that is consistent regarding the morphology of 3D objects. Moreover, the medoid 3D object is displayed in the center. Thus, when the user selects a new hierarchical level, the display of the 3D objects belonging to the new selected cluster follows a consistent logic. The user is never lost. His or her attention is not disturbed by the changes since the medoid 3D object is always located in the center. The changes are regular and continuous from a morphological point of view. This ergonomic effect comes from the construction of the hierarchical tree structure, via the medoid signature, and the specific display of the method (with the medoid 3D object in the center).

The displaying of the 3D objects of the selected cluster in the first part of the display may further comprise displaying and automatically selecting all the displayed 3D objects of the selected cluster in the first part of the display. The method may store in a memory which of the displayed 3D objects are selected, and by default select all of them. The 3D objects that are selected may be highlighted in the first part of the display, for instance using a different color or a graphical element such as a circle around them. The method may further comprise unselecting, upon user interaction, at least one of the displayed 3D objects thereby obtaining one or more displayed 3D objects that remain selected. The method may remove from the memory the one or more 3D objects that are unselected. The user may unselect the one or more displayed 3D objects by pointing them on the display. The method may further comprise classifying, upon user interaction, the one or more displayed 3D objects that remain selected. The method may consult the memory to find out which of the displayed 3D objects remained selected.

This improves the ergonomics of the classification since the user has the possibility to deselect some of the 3D objects before classifying.

In examples, the user may also unselect none of the displayed 3D objects. In this case, all the displayed 3D object initially selected remain selected. The user may thus classify all the displayed 3D objects without unselected at least one of them prior to the classification.

The classifying of the displayed 3D object may comprise displaying, in a fourth part of the display, a tag input for the displayed 3D objects. The classifying of the displayed 3D object may comprise editing and/or validating, upon user interaction on the fourth part, the tag input. The tag input is a window in the fourth part that display or not a tag. The tag may be inputted by the user inside the tag input. The user may enter a tag in the tag input using a keyboard. Alternatively, the tag input may also be pre-filled with a tag. In this case, the user may modify the tag pre-filled in the tag input, e.g., by using the keyboard. The tag is a keyword or term associated or assigned to information, which describes a characteristic of the displayed 3D object. The keyword or term may be taken from an industry standard, such as the industry standard eCl@ss. The fourth part of the display may also comprise buttons for searching a keyword or term from the industry standard eCl@ss and adding this keyword or term to the tag input. The fourth part of the display may also comprise a validation button for validating the tag pre-filled, edited and/or modified in the tag input. This improves the ergonomics of the classification because the user has the possibility to efficiently validate and/or modify the tag during the classification.

The method may further comprise predicting a tag for the displayed 3D objects by using a machine learning algorithm and suggesting the predicted tag in the tag input. The machine learning algorithm may predict the tag based on the signatures of the displayed 3D objects. The machine learning algorithm may be trained on a previously classified database of 3D objects. The machine learning algorithm may take as input the signature and may output the tag. The signature may also be representative of the morphology of 3D object. The signature may be the same as the signature used by the method during the computing of the multi-level clustering. The signature may also be a different signature.

The prediction of a tag improves the ergonomics of the classification because a relevant prediction of the tag allows the user to quickly validate tags for the 3D objects during the classification.

The tag may also be not suggested in the tag input. For instance, the tag may also be not suggested in the tag input when the confidence level of the prediction is not sufficient, e.g., lower than a boundary.

Each level k of the N successive hierarchical levels may be associated with a respective predefined parameter $\varepsilon_k$ such that, for each k from 2 to N, $\varepsilon_{k-1} < \varepsilon_k$. These predefined parameters may represent thresholds in similarity. The similarity may be derived from the Manhattan distance according to the following formula:

$$sim = \left(1 - \frac{d}{2}\right)^2,$$

where d is a distance between two signatures.

The similarity may be a formula which reduces the distance between 0 and 1. The Manhattan distance may take values from 0 to 2 on normalized vectors in norm 1 (which is the case for the signature). The similarity may be used to go from the [0, 2] interval of the Manhattan distance d to the [0, 1] interval (if d=2, sim=0 and if d=0, sim=1), which is simpler to use later (this is referred to as similarity in percentage). The parameters predefined for each hierarchical level may also be understood in terms of similarity rather than distance.

The computing of the first clusters of the 3D objects of the set may further comprise computing first clusters of the 3D objects of the set, each first cluster gathering 3D objects of the set having a close signature such that $$\|S_j - S_i\| < \varepsilon_1,$$

where $S_i$ and $S_j$ are the signatures of any pair i,j of 3D objects gathered in a first cluster. The first clusters may thus form a first level of the multi-level clustering and may be first level nodes of the hierarchical tree structure. The method may comprise computing a 3D/semantical signature $S_i$ for each 3D object $P_i$. The signature $S_i$ is a vector with a fix dimension. The 3D signature may be 416 floats. The semantic signature may be 500 floats. The more similar 3D objects are, the closer the signatures are in norm. In other words, a space of signatures may be associated with a metric. Thus, two 3D objects $P_i$ and $P_j$ are identical when $S_i = S_j$.

The computing of the one or more second clusters may further comprise computing one or more second clusters of the first clusters, each second cluster gathering one or more first clusters having a close medoid signature such that $$\|S_{medoid\ (i)} - S_{medoid\ (j)}\| < \varepsilon_2$$

where $S_{medoid\ (i)}$ and $S_{medoid\ (j)}$ are the medoid signatures of any pair i,j of first clusters gathered in a second cluster. The one or more second clusters may thus form a second level of the multi-level clustering and may be second level nodes in the hierarchical tree structure. Each second level node may be a parent node of one or more first level nodes.

The computing, iteratively for each successive hierarchical level k of the multi-level clustering after the second hierarchical level and until the last hierarchical level N is reached, of the one or more $k^{th}$ clusters of the $(k-1)^{th}$ clusters may further comprise computing one or more $k^{th}$ clusters, each cluster of the one or more $k^{th}$ clusters gathering one or more $(k-1)^{th}$ clusters having a close medoid signature such that $$\|S_{medoid\ (i)} - S_{medoid\ (j)}\| < \varepsilon_k,$$

where $S_{medoid\ (i)}$ and $S_{medoid\ (j)}$ are the medoid signatures of any pair i,j of $(k-1)^{th}$ clusters gathered in a $k^{th}$ cluster. The one or more $k^{th}$ clusters may be $k^{th}$ level nodes in the hierarchical tree structure and each $k^{th}$ level node may be a parent node of one or more $(k-1)^{th}$ level nodes.

The first three successive hierarchical levels may be associated with predefined parameters of respectively $\varepsilon_1 = 0.05$, $\varepsilon_2 = 0.2$ and $\varepsilon_3 = 0.33$. This combination of predefined parameters is satisfactory both in terms of industrial usefulness and visual comparison.

In examples, the method may further comprise learning a machine learning algorithm based on the classified set of 3D objects. The method improves the learning of machine learning algorithm. Indeed, tags have been associated to each of the 3D object of the set. Thus, the machine learning algorithm may be trained on the classified set of 3D objects. For instance, the machine learning algorithm may be trained to predict tags of 3D object. The method therefore allows training such a machine learning algorithm since the learning of such machine learning algorithm requires massive classified sets of 3D objects.

In other examples, the method may further comprise searching, automatically or upon user interaction, 3D objects based on the classified set of 3D objects. The search of 3D objects is improved since tags describing features of objects have been associated to each 3D object of the set. The user may navigate through the classified set of 3D objects, via the associated tags. The method therefore improves the search of 3D objects.

Figure 5:
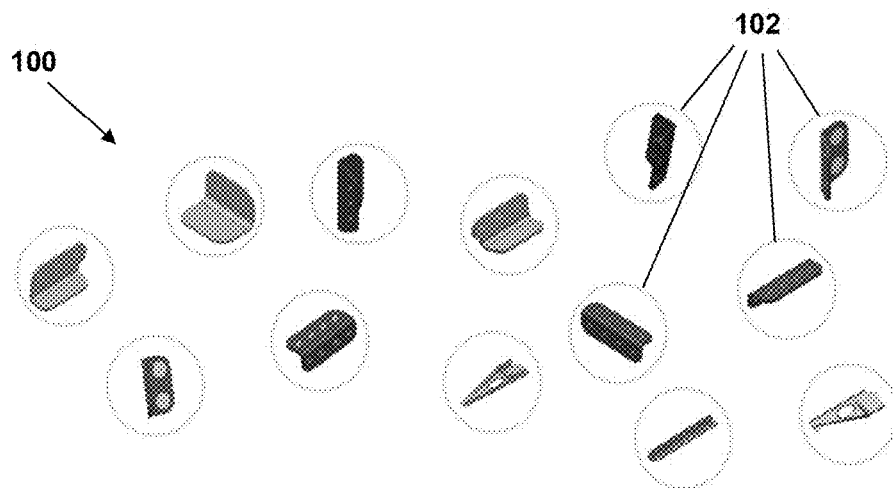
FIG. 5 shows an example of a set of 3D objects.

FIG. 5 shows an example of a set of 3D objects. The set 500 of 3D objects comprises several 3D objects 502. When the set 500 of 3D objects is provided, before the computing of the multi-level computing, the set 500 of 3D objects is not structured, as illustrated in this figure.

Figure 6:
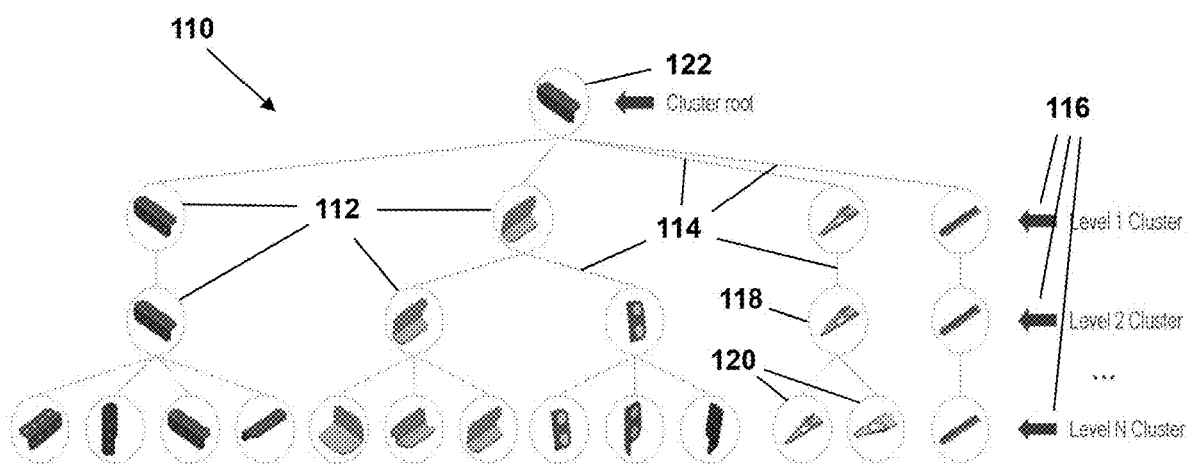
FIG. 6 shows an example of a multi-level clustering.

FIG. 6 shows an example of a multi-level clustering. The multi-level clustering 110 is a hierarchical tree structure of clusters of 3D objects of the set. The multi-level clustering 110 has N=3 hierarchical levels 116. The tree structure represents the hierarchical nature of the multi-level clustering in a graphical form. The tree structure comprises nodes 112 and branches 114. A parent node is a node one step higher in the hierarchy (i.e. closer to the root node 122) and lying on the same branch. Inversely, a children node is a node one step lower in the hierarchy. For instance, the node 118 is the parent node of nodes 120. Nodes 120 are thus children nodes of node 118. The node 122 is not counted as being a level of the hierarchical level. The tree root node is the medoid of the first level cluster of the multi-level clustering 110.

Figure 7:
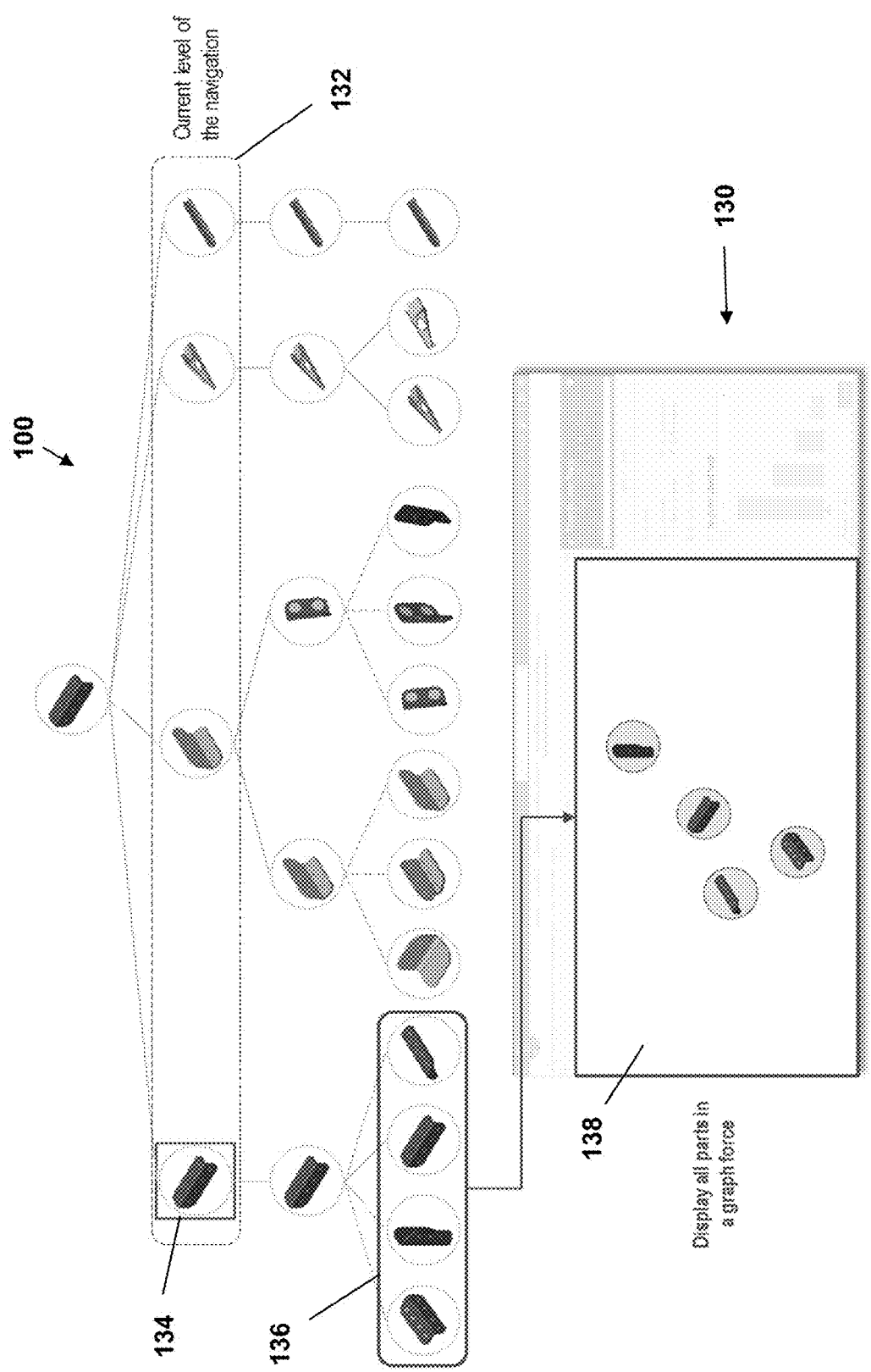
FIG. 7 shows an example of classifying of displayed 3D objects of a cluster.

FIG. 7 shows an example of classifying of displayed 3D objects of a cluster. The method comprises selecting, automatically or upon user interaction, one 134 of the computed clusters of a level of the multi-level clustering thereby defining a current level 132. The method comprises displaying, to a user, 3D objects 136 of the selected cluster 134 in a first part 138 of a display 130. In this example, the 3D objects 136 are four brackets. The method comprises classifying, upon user interaction, the displayed 3D objects 136. A tag may be proposed and/or entered for these four brackets 136. To validate the assignment of the tag to the four brackets 136 (i.e., to validate the classification of the four brackets 136), the user may press a validate button in the GUI.

Figure 8:
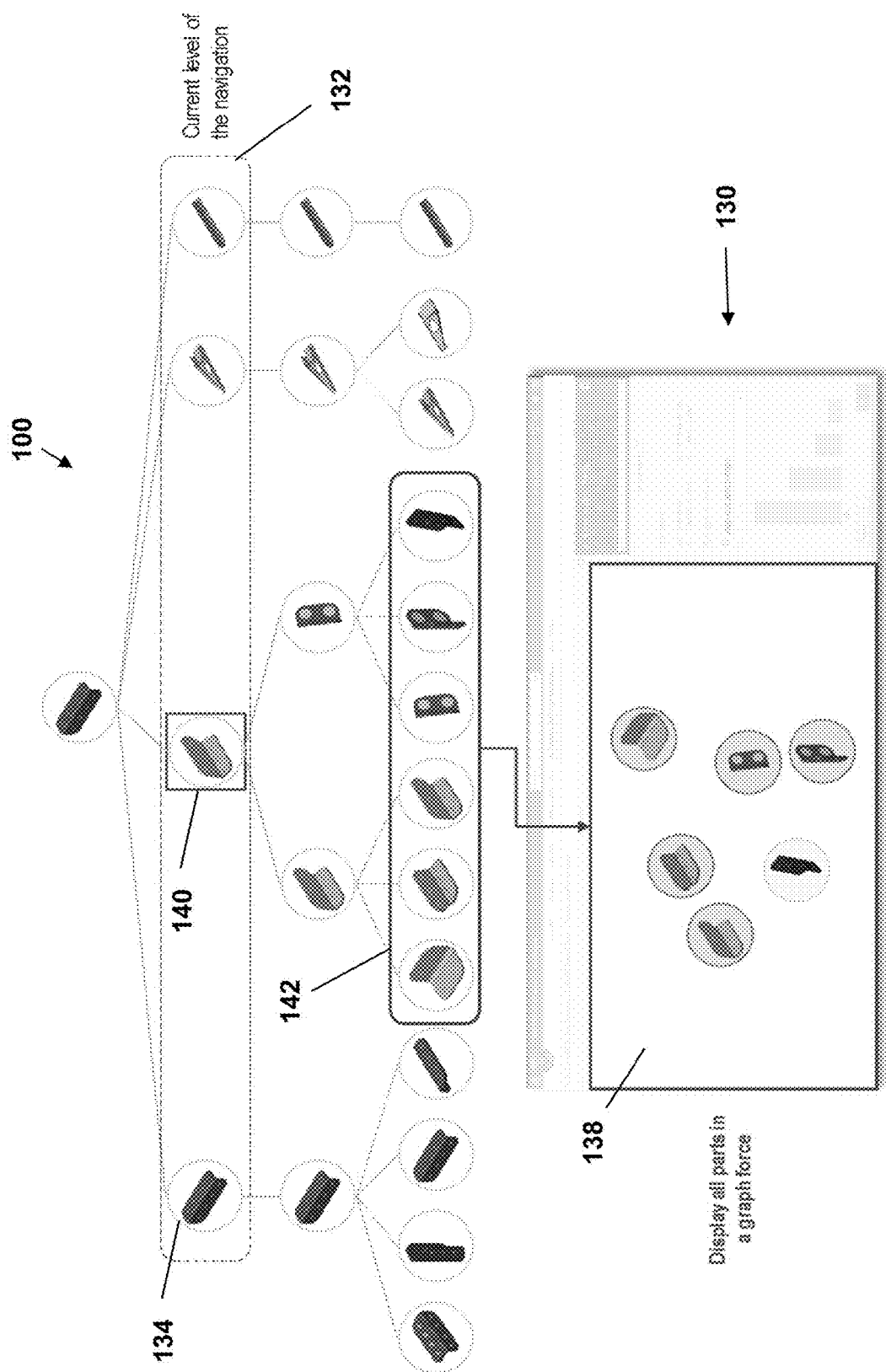
FIG. 8 shows an example of repeating the classifying of displayed 3D objects for a different cluster after the classifying of FIG. 7.

FIG. 8 shows an example of repeating the classifying of displayed 3D objects for a different cluster after the classifying of FIG. 7. The method comprises selecting one 140 of the computed clusters of the current level 132 of the multi-level clustering. The selected one 140 of the computed clusters of the current level 132 is different from the one previously selected 134 The method comprises displaying the 3D objects 142 of the selected cluster 140 in the first part 138 of the display 130. The method comprises classifying the displayed 3D objects 142. As for the classifying of FIG. 7, a tag is proposed and/or entered for the displayed 3D objects 142 (for the six 3D objects 142 that are displayed). To validate the assignment of this tag to the displayed 3D objects 142 (i.e. to validate the classification of the displayed 3D objects 142), the user only may press the validate button in the GUI. Thus, in two clicks on the validate button, user can validate the tagging of ten 3D objects (four in the classifying of FIG. 7 plus six in this FIG. 8).

Figure 9:
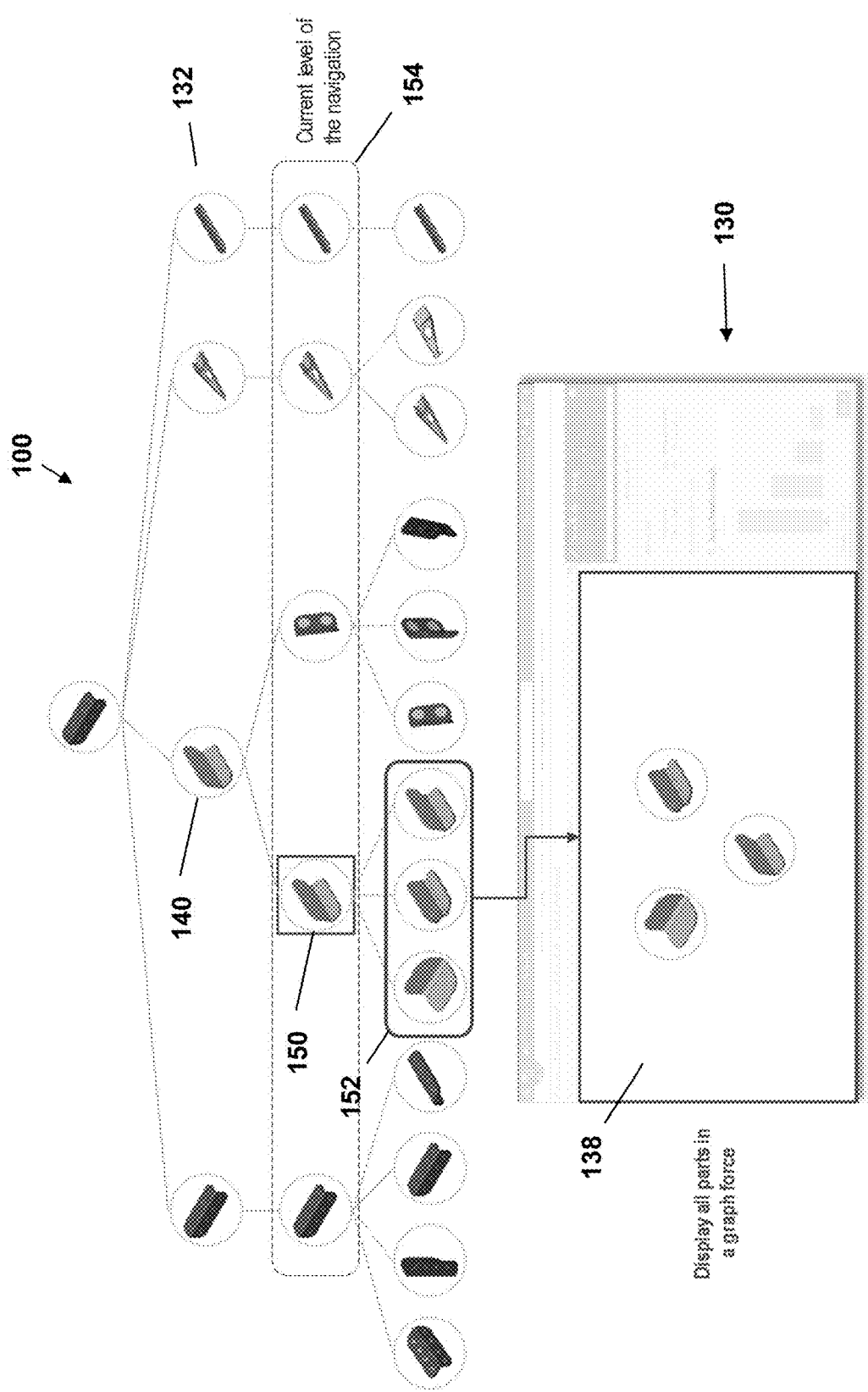
FIG. 9 shows an example of selecting a new hierarchical level before the classifying of FIG. 8.

FIG. 9 shows an example of selecting a new hierarchical level before the classifying of FIG. 8. 2. The method comprises, prior to the classifying of the displayed 3D objects of FIG. 8, selecting, upon user interaction, a new hierarchical level 154 of the multi-level clustering 100 different from the current level 132, thereby defining a new current level 154. Then, the method comprises selecting, automatically or upon user interaction, a new cluster 150 of the new current level 154 that corresponds to a children node 150 of the previously selected cluster 140 in the hierarchical tree structure 100. Then, the method comprises displaying, to the user, 3D objects of the selected new cluster 150 in the first part 138 of the display 130.

Figure 10:
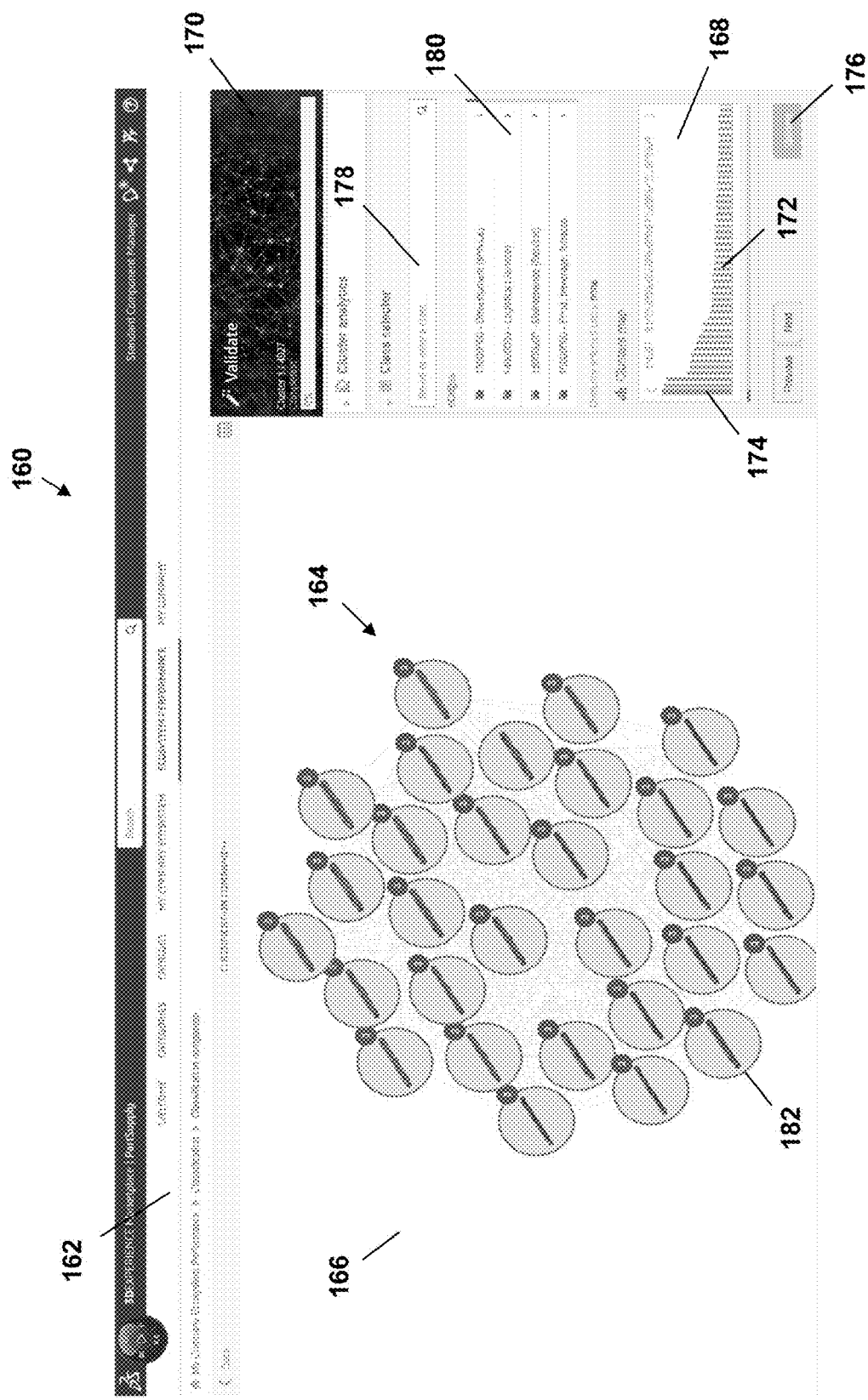
FIG. 10 shows an example of a display.

FIG. 10 shows an example of a display. The display 160 may be a typical graphical user interface (GUI), having standard menu bars 162. Such menu- and toolbars contain a set of user-selectable icons, each icon being associated with one or more operations or functions, as known in the art. Some of these icons are associated with software tools, adapted for editing and/or working on the displayed 3D objects 164.

In this example of FIG. 10, the method comprises displaying, to a user, 3D objects of the selected cluster in a first part 166 of a display 160. In the first part 166, the 3D objects may be displayed in a 2D Bubble representation 164. The displayed 3D objects may be all automatically selected in the first part 166. The 3D objects that are selected may be highlighted by a circle around them.

In this example of FIG. 10, the method comprises displaying, in a third part 168 of the display 160, a second set 172 of icons. Each icon of the second set 172 represents a respective cluster of the new current level. The position of the icons of the second set 172 is organized on the third part 168 of the display 160. The icons of the second set 172 are aligned according to the number of 3D objects that each cluster gathers. The icon 174 of the second set 172 representing the currently selected cluster is highlighted. The icon 174 of the currently selected cluster is displayed with a different color.

In this example of FIG. 10, the classifying of the displayed 3D object 164 comprises displaying, in a fourth part 170 of the display, the tag input 178 for the displayed 3D objects 164. The classifying of the displayed 3D object comprises editing and/or validating, upon user interaction on the fourth part 170, the tag input 178. The tag input may be pre-filled or not with a tag. When the tag input is not pre-filled, the tag may be inputted by the user inside the tag input. The user may enter a tag in the tag input using a keyboard. Alternatively, the tag input may also be pre-filled with a tag. In this case, the user may modify the tag pre-filled in the tag input, e.g., by using the keyboard. In this example, the tag may be taken from the industry standard eCl@ss. To do so, the fourth part 170 of the display 160 comprises buttons 180 for searching and adding a tag from the industry standard eCl@ss. The fourth part 170 of the display 160 also comprises a validation button 176 for validating the tag inputted in the tag input 178.

Figure 11:
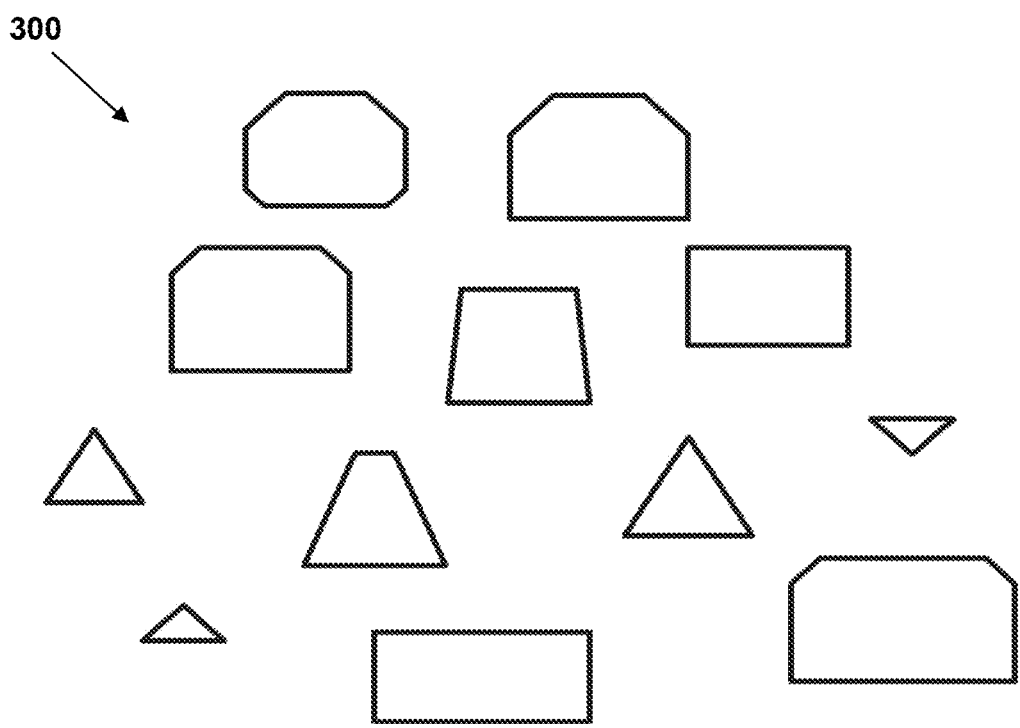
FIGS. 11, 12, 13, 14, 15, 16, 17, 18, 19, 20 and 21 show an example of computing a multi-level clustering of the set of 3D objects of FIG. 5 and another set of 2D objects.

FIGS. 11 to 21 show an example of computing the multi-level clustering of the set of 3D objects. The set of 3D objects considered in this example is the set of 3D objects 100 illustrated in FIG. 5. For clarity purpose, an example of computing of a multi-level clustering of another set of 2D objects is also detailed. The set of 2D objects 300 is illustrated in FIG. 11. The steps for computing the multi-level clustering of the two sets are detailed in following paragraphs.

In this example, the multi-level clustering that is computed is a hierarchical tree structure having three hierarchical levels. For each of the three hierarchical levels, the method associates a respective predefined parameter $\varepsilon_1$, $\varepsilon_2$ and $\varepsilon_3$. such that $\varepsilon_1 < \varepsilon_2 < \varepsilon_3$. In this example, the three hierarchical levels are associated with predefined parameters of respectively $\varepsilon_1 = 0.05$, $\varepsilon_2 = 0.2$ and $\varepsilon_3 = 0.33$.

Figure 12:
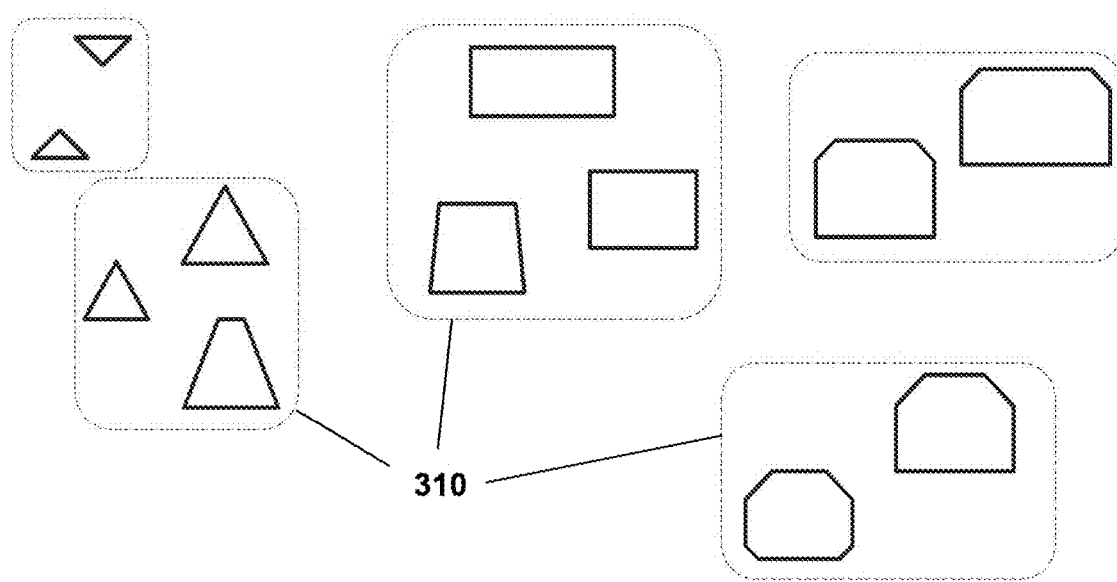
Figure 13:
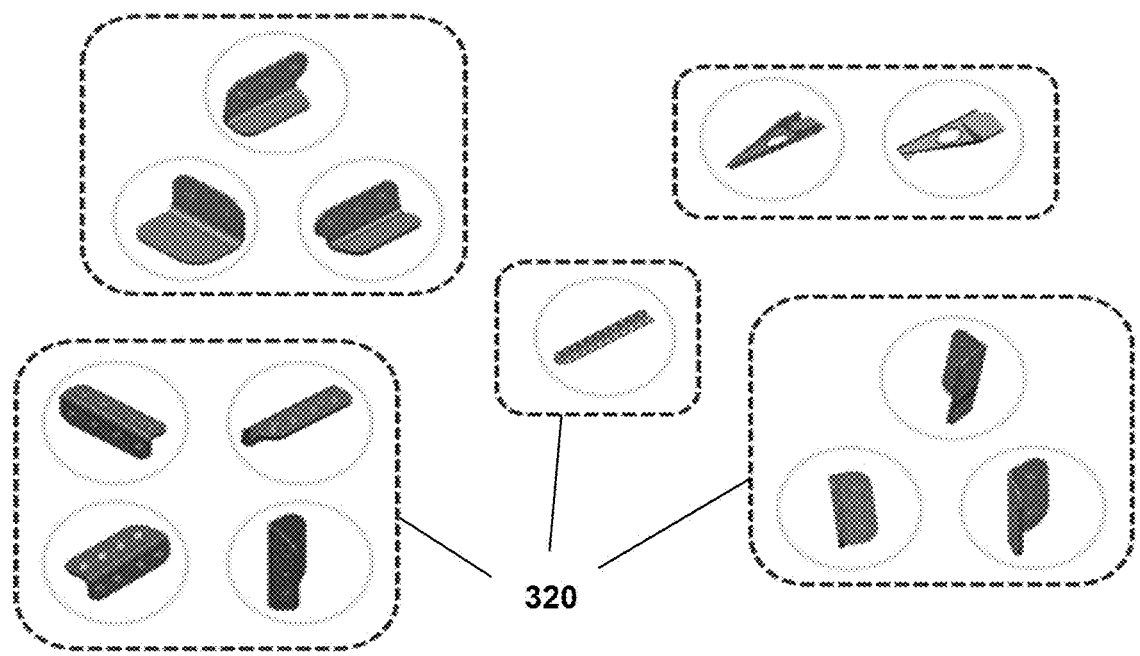

The method starts by computing all first clusters, i.e. clusters of the first level. Each first cluster gathers 3D objects of the set having a close signature such that $$\|S_j - S_i\| < \varepsilon_1,$$

where $S_i$ and $S_j$ are the signatures of any pair i,j of 3D objects gathered in a first cluster. The first clusters form the first level of the multi-level clustering. The first clusters are first level nodes of the hierarchical tree structure. FIG. 12 illustrates first clusters computed for the set of 2D objects and FIG. 13 first clusters computed for the set of 3D objects.

The computing of clusters is now discussed. The method computes a signature for each 3D object of the set. The computed signatures therefore form a set of vectors (each signature being a vector). From a given set of vectors, several clustering algorithms may be used to compute clusters. Many of these clustering algorithms need a pre-defined number of cluster (e.g., k-Means algorithm). Some other algorithms do not require this hyper-parameter, but are notoriously slow, as they require an important number of pairwise comparison (e.g. Agglomerative Clustering, DBSCAN). In order to tackle this issue, the method computes clusters based on an algorithm based on Fast Approximate Nearest Neighbors search that has been devised and that, given a distance, finds a stable clustering distribution satisfying the above problem.

Figure 14:
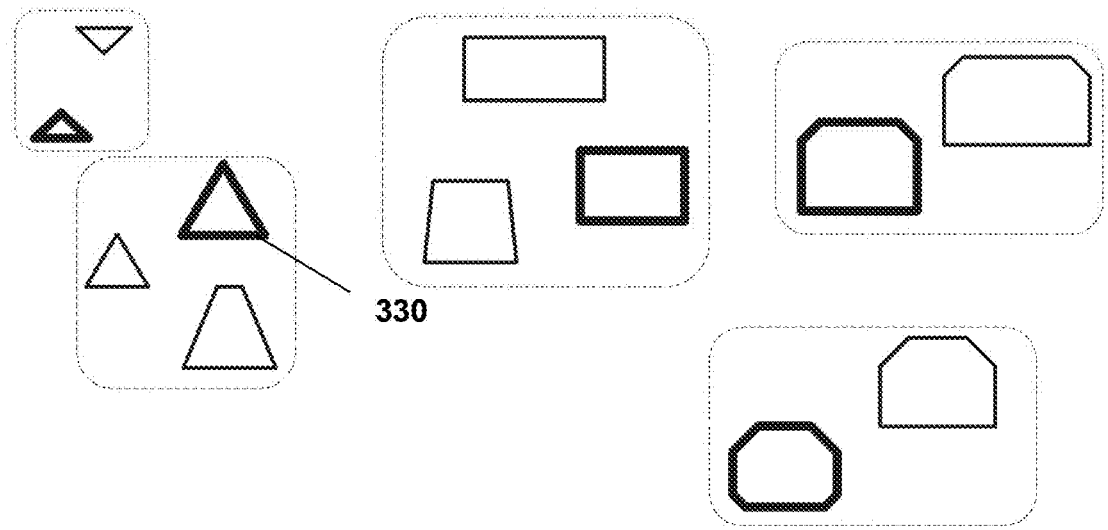
Figure 15:
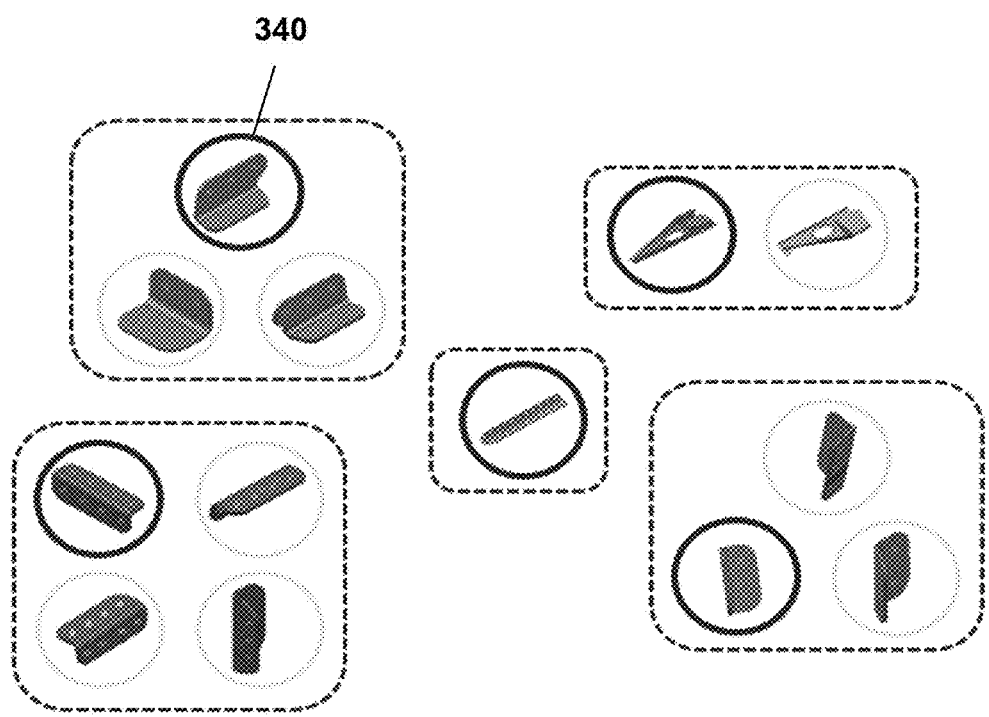

Now, for each first cluster, the method computes the centroid signature of the cluster. The centroid signature is computed using the average of signatures of 3D objects of the cluster. When the centroid signatures are computed, the method determines the medoid 3D object of each cluster. The medoid is, for each cluster, the 3D object that has a signature that is the closest to the centroid signature. In FIG. 14, the determined medoid 2D objects 330 for the clusters of the set of 2D objects are highlighted. Similarly, the determined medoid 3D objects 340 for the clusters of the set of 3D objects are highlighted in FIG. 15.

Figure 16:
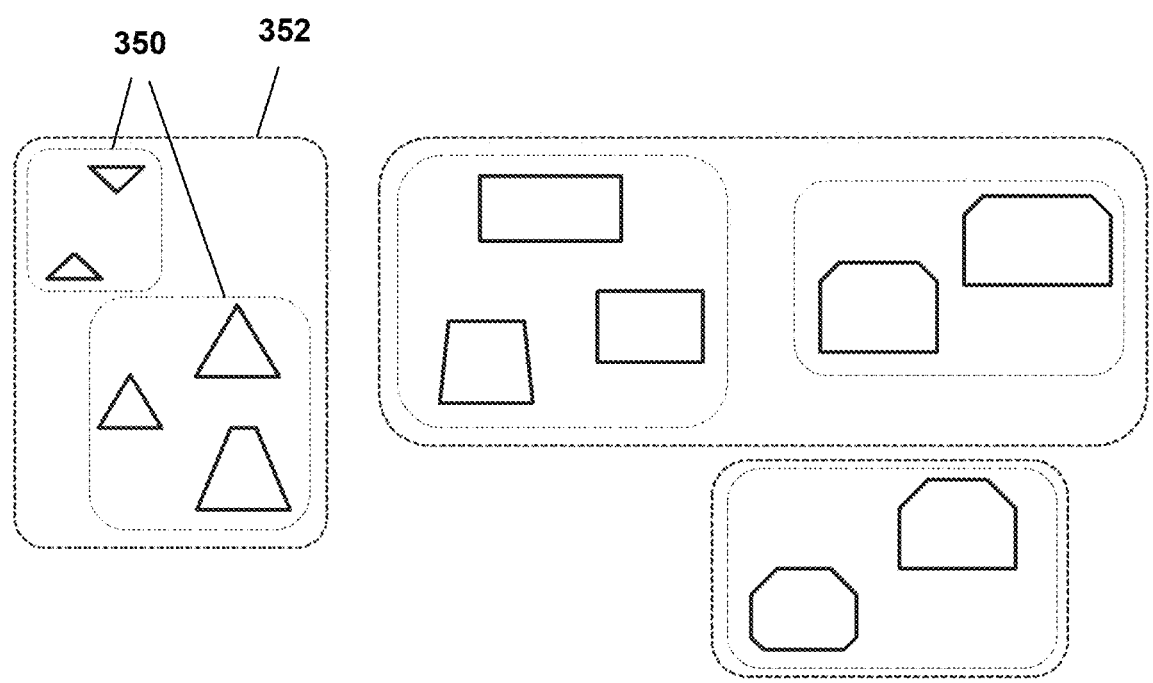
Figure 17:
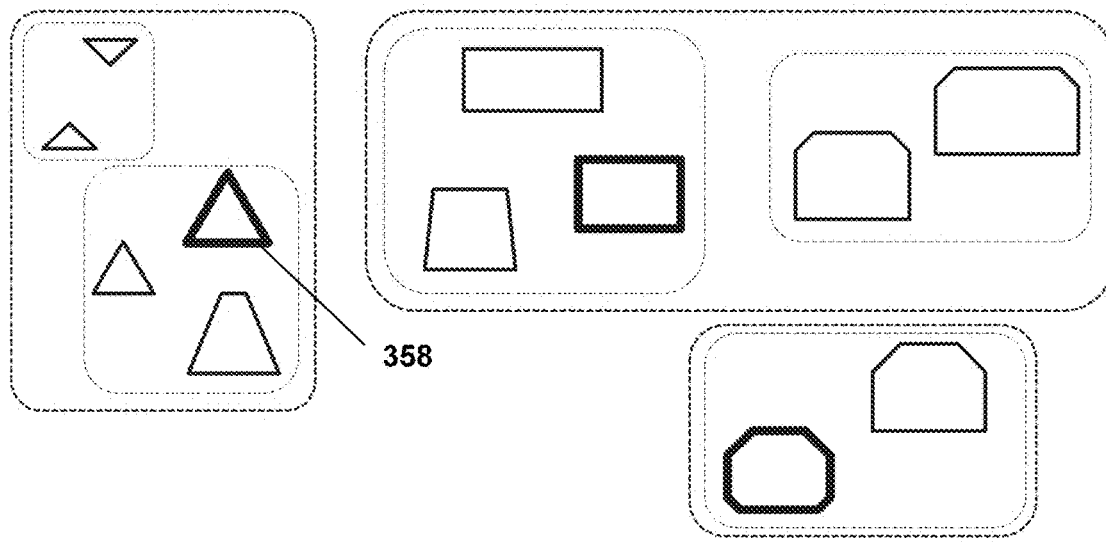
Figure 18:
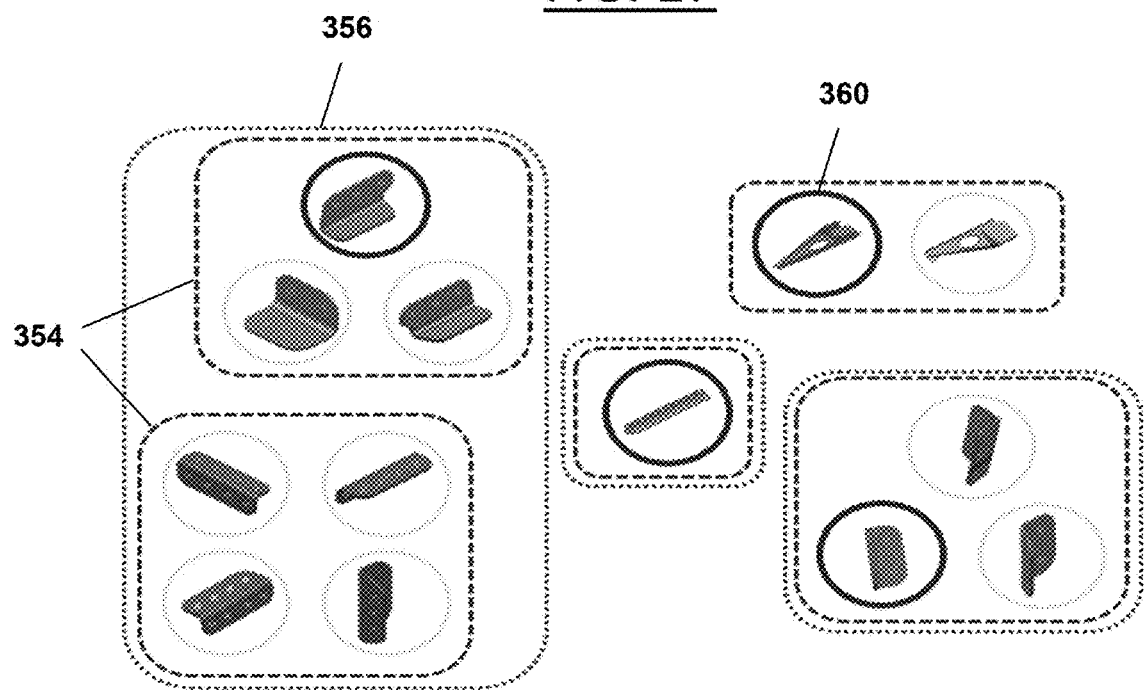

Then, the method computes the second clusters. The second clusters are clusters that gather one or more first clusters having a close medoid signature such that $$\|S_{medoid\ (i)} - S_{medoid\ (j)}\| < \varepsilon_2,$$

where $S_{medoid\ (i)}$ and $S_{medoid\ (j)}$ are the medoid signatures of any pair i,j of first clusters gathered in a second cluster. The second clusters form the second level of the multi-level clustering. The second clusters are second level nodes in the hierarchical tree structure. Each second level node may be a parent node of one or more first level nodes. FIG. 16 shows an example of computing the second clusters for the set of 2D objects. In this example, a second clusters 352 gathers two first clusters 350. Similarly, FIG. 18 shows an example of computing the second clusters for the set of 3D objects. In this example, a second clusters 356 gathers two first clusters 354.

As for the first clusters, the method computes the medoid signature of each of the second cluster. The determined medoid 2D objects 358 for the second clusters of the set of 2D objects are highlighted in FIG. 17 and the determined medoid 3D objects 360 for the clusters of the set of 3D objects are highlighted in FIG. 18.

Figure 19:
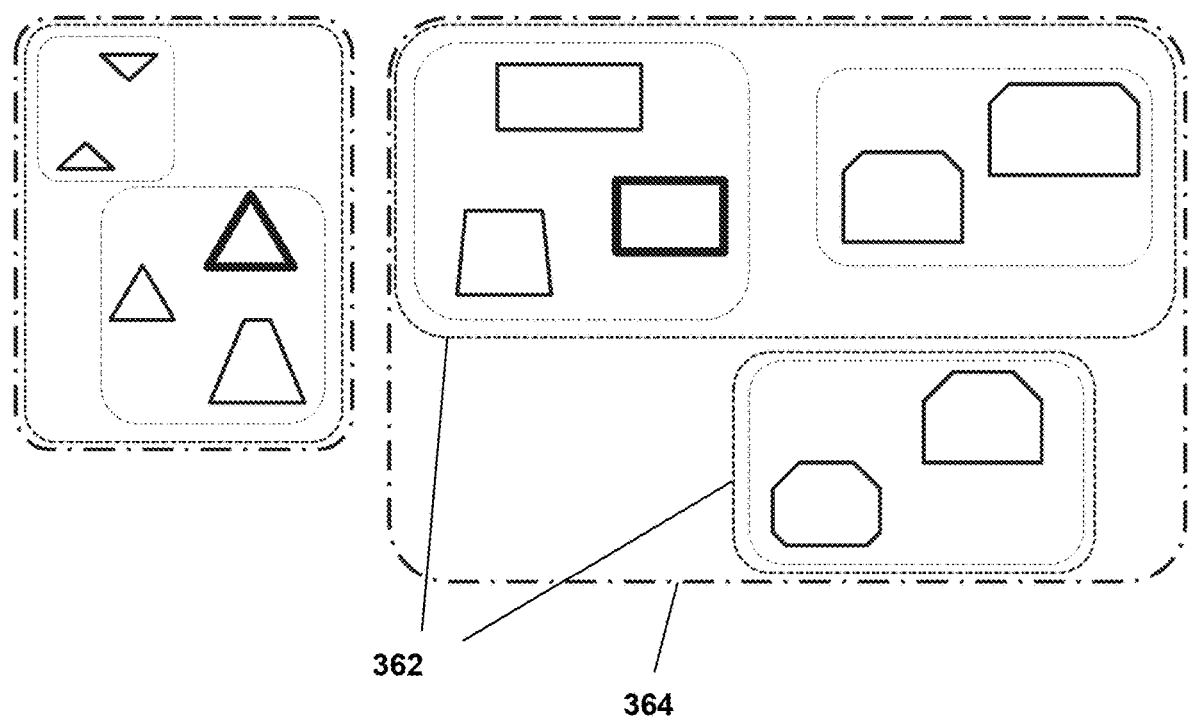

Then, the method computes the third clusters. The third clusters are clusters that gather one or more second clusters having a close medoid signature such that $$\|S_{medoid\ (i)} - S_{medoid\ (j)}\| < \varepsilon_3,$$

where $S_{medoid\ (i)}$ and $S_{medoid\ (j)}$ are the medoid signatures of any pair i,j of second clusters gathered in a third cluster. The third clusters form the third level of the multi-level clustering. The third clusters are third level nodes in the hierarchical tree structure. Each third level node is a parent node of one or more second level nodes. FIG. 19 shows an example of computing the third clusters for the set of 2D objects. In this example, a third clusters 354 gathers two second clusters 362.

The computing, iteratively for each successive hierarchical level k of the multi-level clustering after the second hierarchical level and until the last hierarchical level N is reached, of the one or more $k^{th}$ clusters of the $(k-1)^{th}$ clusters may further comprise computing one or more $k^{th}$ clusters, each cluster of the one or more $k^{th}$ clusters gathering one or more $(k-1)^{th}$ clusters having a close medoid signature such that $$\|S_{medoid\ (i)} - S_{medoid\ (j)}\| < \varepsilon_k,$$

where $S_{medoid\ (i)}$ and $S_{medoid\ (j)}$ are the medoid signatures of any pair i,j of $(k-1)^{th}$ clusters gathered in a $k^{th}$ cluster. The one or more $k^{th}$ clusters may be $k^{th}$ level nodes in the hierarchical tree structure and each $k^{th}$ level node may be a parent node of one or more $(k-1)^{th}$ level nodes.

Figure 20:
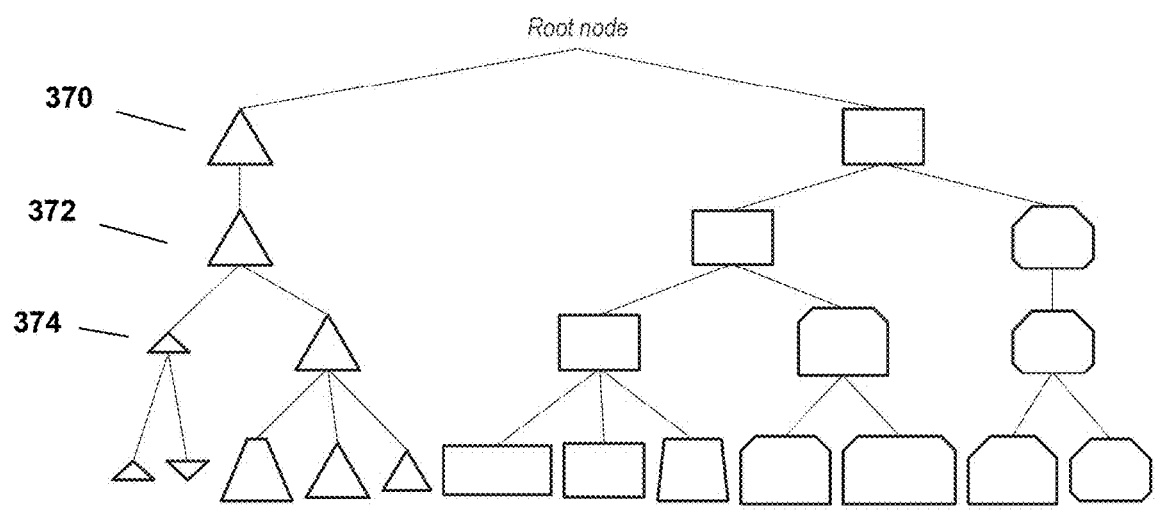
Figure 21:
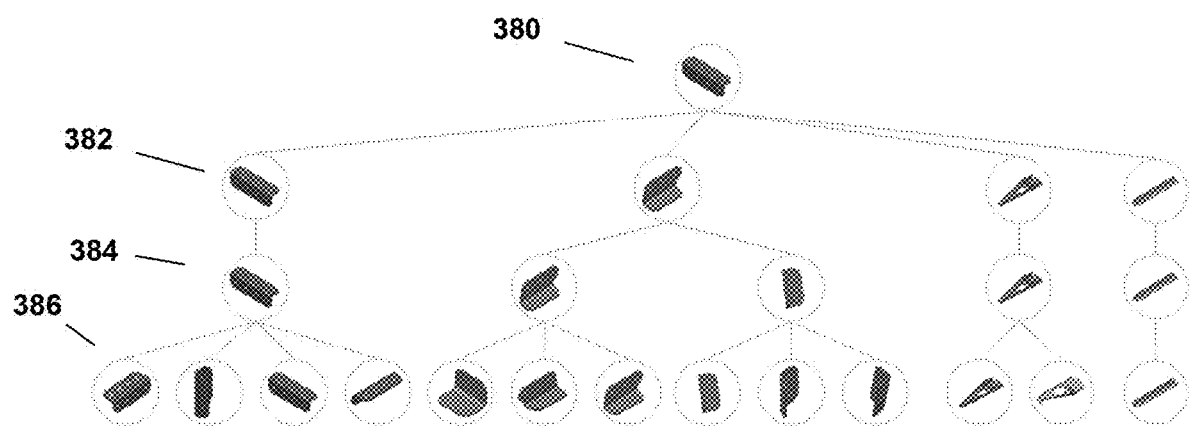

FIGS. 20 and 21 show the computed multi-level clustering for each of the set of 2D object and the set of 3D object. The multi-level clustering of the set of 2D object has tree hierarchical levels: the first level 374, the second level 372 and the third level 370. Similarly, the multi-level clustering of for the set of 3D object has tree hierarchical levels: the first level 384, the second level 382 and the third level 380. The third clusters of the third level 380 are parent nodes of the second clusters of the second level 382, which are in turn parent nodes of the first clusters of the first level 384, the first level 384 gathering the 3D objects of the set 386. The multi-level clustering is graphically represented in these FIGS. 20 and 21. The method may comprise displaying, to the user, a graphical representation of the multi-level clustering in the display. The graphical representation may comprise elements representing nodes and branches of the computed hierarchical tree structure. For each level of hierarchical tree structure, each cluster (or node) may be represented by its respective medoid 3D object.

Figure 22:
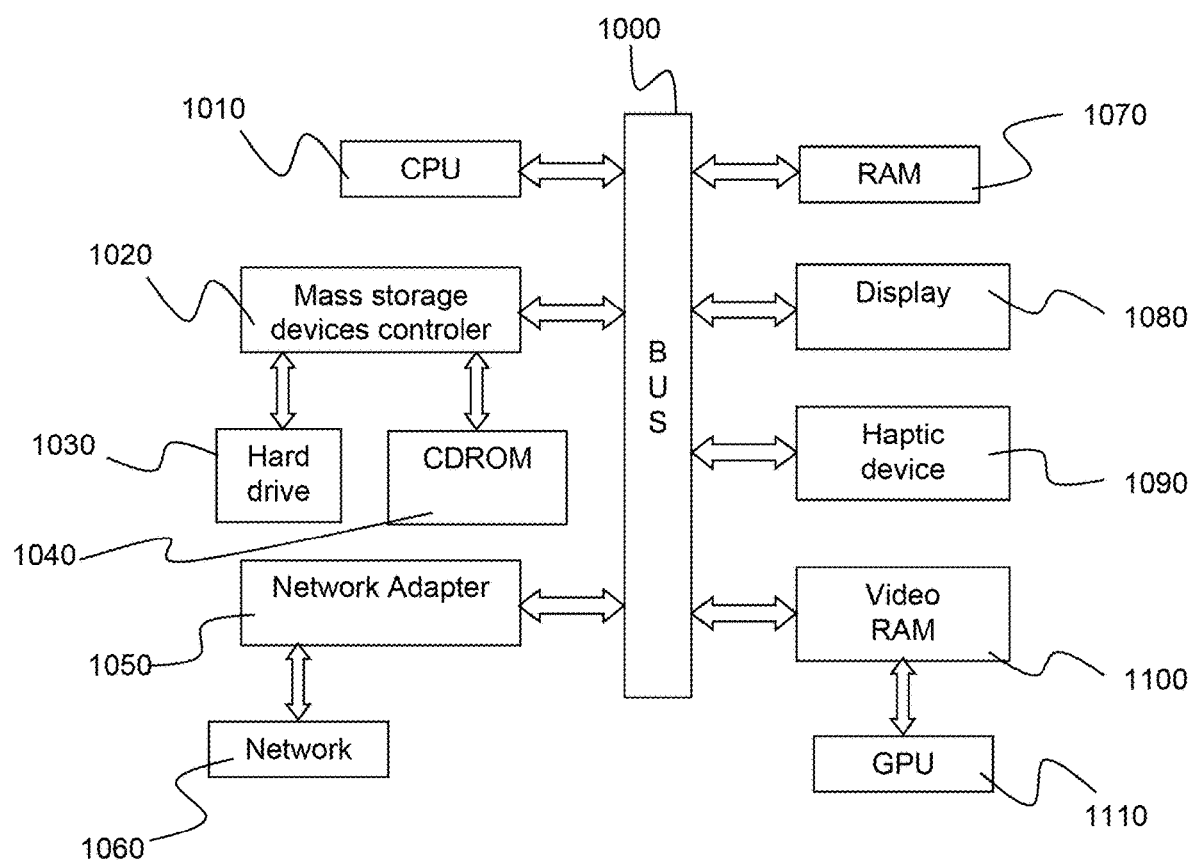
FIG. 22 shows an example of the system.

FIG. 22 shows an example of the system, wherein the system is a client computer system, e.g., a workstation of a user.

The client computer of the example comprises a central processing unit (CPU) 1010 connected to an internal communication BUS 1000, a random-access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

The invention claimed is:

1. A computer-implemented method for classifying three-dimensional (3D) objects, the method comprising:
   obtaining a set of 3D objects, each 3D object of the set having a signature representative of morphology of the 3D object;
   computing a multi-level clustering of the set of 3D objects, the multi-level clustering being a hierarchical tree structure of clusters of 3D objects of the set and having N hierarchical levels, the computing including:
      computing first clusters of the 3D objects of the set, each first cluster gathering 3D objects of the set having a close signature, the first clusters thus forming a first level of the multi-level clustering and being first level nodes of the hierarchical tree structure,
      computing one or more second clusters of the first clusters, each second cluster gathering one or more first clusters having a close medoid signature, the one or more second clusters thus forming a second level of the multi-level clustering and being second level nodes in the hierarchical tree structure, each second level node being a parent node of one or more first level nodes, and
      computing, iteratively for each successive hierarchical level k of the multi-level clustering after the second hierarchical level and until the last hierarchical level N is reached, one or more $k^{th}$ clusters of the $(k-1)^{th}$ clusters, each cluster of the one or more $k^{th}$ clusters gathering one or more $(k-1)^{th}$ clusters having a close medoid signature, one or more $k^{th}$ clusters being $k^{th}$ level nodes in the hierarchical tree structure and each $k^{th}$ level node being a parent node of one or more $(k-1)^{th}$ level nodes;
   selecting, automatically or upon user interaction, one of the computed clusters of a level of the multi-level clustering thereby defining a current level;
   displaying, to a user, 3D objects of the selected cluster in a first part of a display; and
   classifying, upon user interaction, the displayed 3D objects.

2. The computer-implemented method of claim 1, further comprising, prior to the classifying of the displayed 3D objects:
   selecting, upon user interaction, a new hierarchical level of the multi-level clustering different from the current level, thereby defining a new current level;
   selecting, automatically or upon user interaction, a new cluster of the new current level that corresponds to a parent node or a children node of previously selected cluster in the hierarchical tree structure; and
   displaying, to the user, 3D objects of the selected new cluster in the first part of the display.

3. The computer-implemented method of claim 2, further comprising, prior to the displaying the 3D objects and classifying the displayed 3D objects:
   displaying, in a second part of the display, a first set of icons, each icon representing a respective level of the multi-level clustering,
   wherein the selecting, upon user interaction, of the new hierarchical level is performed by selecting one of the displayed icons of the first set, the selected new hierarchical level being the one represented by the selected icon.

4. The computer-implemented method of claim 2, further comprising, prior to the displaying the 3D objects and the classifying the displayed 3D objects:
   displaying, in a third part of the display, a second set of icons, each icon of the second set representing a respective cluster of the new current level,
   wherein the selecting, upon user interaction, of the cluster of the current level is performed by selecting one of the displayed icons of the second set, the selected cluster being the one represented by the selected icon.

5. The computer-implemented method of claim 1, further comprising, repeating:
   the selecting of one of the computed clusters of the current level of the multi-level clustering, the selected one of the computed clusters of the current level being different from the one previously selected;
   the displaying of the 3D objects of the selected cluster in the first part of the display; and
   the classifying of the displayed 3D objects.

6. The computer-implemented method of claim 1, further comprising:
   selecting a technical domain to which the set of 3D objects belongs;
   predicting, by a machine learning algorithm, an appropriate level of the multi-level clustering based on the selected technical domain; and
   defining the predicted appropriate level as being the current level.

7. The computer-implemented method of claim 1, further comprising, for each cluster:
   determining a medoid 3D object among the 3D objects of the cluster, the medoid 3D object having a signature $S_{medoid}$ that is the closest to a centroid signature of the cluster according to the following formula:

$$S_{medoid} \text{ with medoid} = \operatorname{argmin}_i \|S_i - S_{centroid}\|,$$

wherein $S_i$ is the signature of each object i of the cluster, $S_{medoid}$ is the signature of the medoid 3D object of the cluster and $S_{centroid}$ is the centroid signature of the cluster, wherein the centroid signature $S_{centroid}$ of the cluster is computed using an average of signatures of 3D objects of the cluster according to the following formula:

$$S_{centroid} = \frac{1}{M}\sum_{i=1}^{M} S_i,$$

where M is the number of 3D objects gathered in the cluster and $S_i$ is the signature of each 3D object i included in the cluster; and wherein the displaying of the 3D objects of the selected cluster in the first part of the display further comprises:

computing, for each pair of 3D objects of the set gathered in the cluster, a distance between the 3D objects of the pair on the display that is proportional to the distance between the signatures of the 3D objects of the pair; and placing the 3D objects in the first part of the display by using the computed distance between the 3D objects of the pair on the display, the determined medoid 3D object of the selected cluster is displayed in the center of the first part.

8. The computer-implemented method of claim 1, wherein the displaying the 3D objects of the selected cluster in the first part of the display further comprises:

displaying and automatically selecting all the displayed 3D objects of the selected cluster in a first part of a display; and further comprising:

unselecting, upon user interaction, at least one of the displayed 3D objects thereby obtaining one or more displayed 3D objects that remain selected; and classifying, upon user interaction, the one or more displayed 3D objects that remain selected.

9. The computer-implemented method of claim 1, wherein the classifying of the displayed 3D object comprises:

displaying, in a fourth part of the display, a tag input for the displayed 3D objects; and editing and/or validating, upon user interaction on the fourth part, the tag input.

10. The computer-implemented method of claim 9, further comprising:

predicting a tag for the displayed 3D objects by using a machine learning algorithm and suggesting the predicted tag in the tag input, the machine learning algorithm predicting the tag based on the signatures of the displayed 3D objects.

11. The computer-implemented method of claim 1, wherein each level k of the N successive hierarchical levels is associated with a respective predefined parameter $\varepsilon_k$ such that, for each k from 2 to N, $\varepsilon_{k-1} < \varepsilon_k$, computing the first clusters of the 3D objects of the set further comprises computing first clusters of the 3D objects of the set, each first cluster gathering 3D objects of the set having a close signature such that $$\|S_j - S_i\| < \varepsilon_1,$$

where $S_i$ and $S_j$ are the signatures of any pair i,j of 3D objects gathered in a first cluster, the first clusters thus forming a first level of the multi-level clustering and being first level nodes of the hierarchical tree structure, computing the one or more second clusters further comprises computing one or more second clusters of the first clusters, each second cluster gathering one or more first clusters having a close medoid signature such that $$\|S_{medoid\ (i)} - S_{medoid\ (j)}\| < \varepsilon_2,$$

where $S_{medoid\ (i)}$ and $S_{medoid\ (j)}$ are the medoid signatures of any pair i,j of first and clusters gathered in a second cluster, the one or more second clusters thus forming a second level of the multi-level clustering and being second level nodes in the hierarchical tree structure, each second level node being a parent node of one or more first level nodes, and computing, iteratively for each successive hierarchical level k of the multi-level clustering after the second hierarchical level and until the last hierarchical level N is reached, the one or more $k^{th}$ clusters of the $(k-1)^{th}$ clusters further comprising computing one or more $k^{th}$ clusters, each cluster of the one or more $k^{th}$ clusters gathering one or more $(k-1)^{th}$ clusters having a close medoid signature such that $$\|S_{medoid\ (i)} - S_{medoid\ (j)}\| < \varepsilon_k,$$

where $S_{medoid\ (i)}$ and $S_{medoid\ (j)}$ are the medoid signatures of any pair i,j of $(k-1)^{th}$ clusters gathered in a $k^{th}$ cluster, the one or more $k^{th}$ clusters being $k^{th}$ level nodes in the hierarchical tree structure and each $k^{th}$ level node being a parent node of one or more $(k-1)^{th}$ level nodes.

12. The computer-implemented method of claim 1, wherein a distance between signatures is a Manhattan distance between the signatures.

13. A non-transitory computer-readable storage medium having recorded thereon a computer program comprising instructions for performing a method for classifying three-dimensional (3D) objects, the method comprising:

obtaining a set of 3D objects, each 3D object of the set having a signature representative of morphology of the 3D object;

computing a multi-level clustering of the set of 3D objects, the multi-level clustering being a hierarchical tree structure of clusters of 3D objects of the set and having N hierarchical levels, the computing incudes:

computing first clusters of the 3D objects of the set, each first cluster gathering 3D objects of the set having a close signature, the first clusters thus forming a first level of the multi-level clustering and being first level nodes of the hierarchical tree structure, computing one or more second clusters of the first clusters, each second cluster gathering one or more first clusters having a close medoid signature, the one or more second clusters thus forming a second level of the multi-level clustering and being second level nodes in the hierarchical tree structure, each second level node being a parent node of one or more first level nodes, computing, iteratively for each successive hierarchical level k of the multi-level clustering after the second hierarchical level and until the last hierarchical level N is reached, one or more $k^{th}$ clusters of the $(k-1)^{th}$ clusters, each cluster of the one or more $k^{th}$ clusters gathering one or more $(k-1)^{th}$ clusters having a close medoid signature, one or more $k^{th}$ clusters being $k^{th}$ level nodes in the hierarchical tree structure and each $k^{th}$ level node being a parent node of one or more $(k-1)^{th}$ level nodes;

selecting, automatically or upon user interaction, one of the computed clusters of a level of the multi-level clustering thereby defining a current level;

displaying, to a user, 3D objects of the selected cluster in a first part of a display; and classifying, upon user interaction, the displayed 3D objects.

14. The non-transitory computer-readable storage medium of claim 13, wherein the method further comprises, prior to the classifying of the displayed 3D objects:

selecting, upon user interaction, a new hierarchical level of the multi-level clustering different from the current level, thereby defining a new current level;

selecting, automatically or upon user interaction, a new cluster of the new current level that corresponds to a parent node or a children node of previously selected cluster in the hierarchical tree structure; and displaying, to the user, 3D objects of the selected new cluster in the first part of the display.

15. The non-transitory computer-readable storage medium of claim 14, wherein the method further comprises, prior to the displaying the 3D objects and classifying the displayed 3D objects:

displaying, in a second part of the display, a first set of icons, each icon representing a respective level of the multi-level clustering, and wherein the selecting, upon user interaction, of the new hierarchical level is performed by selecting one of the displayed icons of the first set, the selected new hierarchical level being the one represented by the selected icon.

16. The non-transitory computer-readable storage medium of claim 14, wherein the method comprises, prior to the displaying the 3D objects and classifying the displayed 3D objects:

displaying, in a third part of the display, a second set of icons, each icon of the second set representing a respective cluster of the new current level, and wherein the selecting, upon user interaction, of the cluster of the current level is performed by selecting one of the displayed icons of the second set, the selected cluster being the one represented by the selected icon.

17. A computer system comprising:

a processor coupled to a memory, the memory having recorded thereon a program comprising instructions for classifying three-dimensional (3D) objects that when executed by the processor causes the processor to be configured to:

obtain a set of 3D objects, each 3D object of the set having a signature representative of morphology of the 3D object, compute a multi-level clustering of the set of 3D objects, the multi-level clustering being a hierarchical tree structure of clusters of 3D objects of the set and having N hierarchical levels, the processor being configured to compute the multi-level clustering by being further configured to:

compute first clusters of the 3D objects of the set, each first cluster gathering 3D objects of the set having a close signature, the first clusters thus forming a first level of the multi-level clustering and being first level nodes of the hierarchical tree structure, compute one or more second clusters of the first clusters, each second cluster gathering one or more first clusters having a close medoid signature, the one or more second clusters thus forming a second level of the multi-level clustering and being second level nodes in the hierarchical tree structure, each second level node being a parent node of one or more first level nodes, and compute, iteratively for each successive hierarchical level k of the multi-level clustering after the second hierarchical level and until the last hierarchical level N is reached, one or more $k^{th}$ clusters of the $(k-1)^{th}$ clusters, each cluster of the one or more $k^{th}$ clusters gathering one or more $(k-1)^{th}$ clusters having a close medoid signature, the one or more $k^{th}$ clusters being $k^{th}$ level nodes in the hierarchical tree structure and each $k^{th}$ level node being a parent node of one or more $(k-1)^{th}$ level nodes, and select, automatically or upon user interaction, one of the computed clusters of a level of the multi-level clustering thereby defining a current level, display, to a user, 3D objects of the selected cluster in a first part of a display, and classify, upon user interaction, the displayed 3D objects.

18. The computer system of claim 17, wherein the processor is further configured to, prior to being configured to classify the displayed 3D objects:

select, upon user interaction, a new hierarchical level of the multi-level clustering different from the current level, thereby defining a new current level, select, automatically or upon user interaction, a new cluster of the new current level that corresponds to a parent node or a children node of previously selected cluster in the hierarchical tree structure, and display, to the user, 3D objects of the selected new cluster in the first part of the display.

19. The computer system of claim 18, wherein the processor is further configured to, prior to being configured to display the 3D objects and classify the displayed objects:

display, in a second part of the display, a first set of icons, each icon representing a respective level of the multi-level clustering, wherein the selection, upon user interaction, of the new hierarchical level is performed by selecting one of the displayed icons of the first set, the selected new hierarchical level being the one represented by the selected icon.

20. The computer system of claim 18, wherein the processor is further configured to, prior to being configured to display the 3D objects and classify the displayed objects:

display, in a third part of the display, a second set of icons, each icon of the second set representing a respective cluster of the new current level, wherein the selection, upon user interaction, of the cluster of the current level is performed by selecting one of the displayed icons of the second set, the selected cluster being the one represented by the selected icon.

* * * * *